United States Patent
Nishibata

(10) Patent No.: US 11,424,670 B2
(45) Date of Patent: Aug. 23, 2022

(54) DRIVE DEVICE FOR SWITCH

(71) Applicant: DENSO CORPORATION, Kariya (JP)

(72) Inventor: Koichi Nishibata, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 17/188,284

(22) Filed: Mar. 1, 2021

(65) Prior Publication Data

US 2021/0184557 A1 Jun. 17, 2021

Related U.S. Application Data

(63) Continuation of application No. PCT/JP2019/030429, filed on Aug. 2, 2019.

(30) Foreign Application Priority Data

Aug. 28, 2018 (JP) .............................. JP2018-159564

(51) Int. Cl.
| | |
|---|---|
| *H02M 1/08* | (2006.01) |
| *H02M 3/158* | (2006.01) |
| *H02M 7/5387* | (2007.01) |
| *H03K 17/16* | (2006.01) |
| *H02M 1/00* | (2006.01) |
| *H02P 27/08* | (2006.01) |

(52) U.S. Cl.
CPC ......... *H02M 1/08* (2013.01); *H02M 7/53871* (2013.01); *H03K 17/165* (2013.01); *H02M 1/0054* (2021.05); *H02M 3/158* (2013.01); *H02P 27/08* (2013.01)

(58) Field of Classification Search
CPC ...... H02M 1/0054; H02M 1/08; H02M 3/158; H02M 7/5387; H02M 7/53871; H02P 27/08; H03K 17/165
USPC .................................. 327/108, 109, 110, 111
See application file for complete search history.

(56) References Cited

U.S. PATENT DOCUMENTS

| | | | | |
|---|---|---|---|---|
| 5,325,258 A | * | 6/1994 | Choi ................... | H03K 17/0828 323/276 |
| 2004/0145406 A1 | * | 7/2004 | Tai ...................... | H03K 17/0828 327/432 |
| 2004/0178759 A1 | * | 9/2004 | Nakamura ......... | B60H 1/00828 318/471 |

(Continued)

FOREIGN PATENT DOCUMENTS

JP 2016178712 A 10/2016

*Primary Examiner* — William Hernandez
(74) *Attorney, Agent, or Firm* — Oliff PLC

(57) ABSTRACT

A drive device performs switching of at least one switch configuring an electrical power converter. The drive device includes a control section that generates a drive signal for the switch and transmits the drive signal, and at least one drive circuit that receives the transmitted drive signal. The control section generates speed adjustment information for adjusting a switching speed of the switch and transmits the speed adjustment information to the drive circuit. The drive circuit includes a speed calculation section that receives the transmitted speed adjustment information and calculates command switching speed information of the switch based on the received speed adjustment information, and a drive section that performs switching of the switch based on the received drive signal and the calculated command switching speed information.

13 Claims, 17 Drawing Sheets

(56) References Cited

U.S. PATENT DOCUMENTS

| | | | |
|---|---|---|---|
| 2005/0128671 A1* | 6/2005 | Miyamoto | H02M 7/538 361/118 |
| 2007/0187217 A1* | 8/2007 | Tai | H02M 1/08 200/237 |
| 2008/0013760 A1* | 1/2008 | Mitsuda | H03K 17/162 381/123 |
| 2018/0248543 A1* | 8/2018 | Senda | H02M 1/32 |
| 2019/0123546 A1* | 4/2019 | Wang | H03K 19/00 |
| 2021/0013792 A1* | 1/2021 | Matsubara | H03K 17/0822 |
| 2021/0044287 A1* | 2/2021 | Yokosyo | H02M 1/32 |
| 2021/0143812 A1* | 5/2021 | Matsubara | H03K 17/284 |
| 2021/0175884 A1* | 6/2021 | Kondo | H02M 1/32 |

* cited by examiner

FIG.19
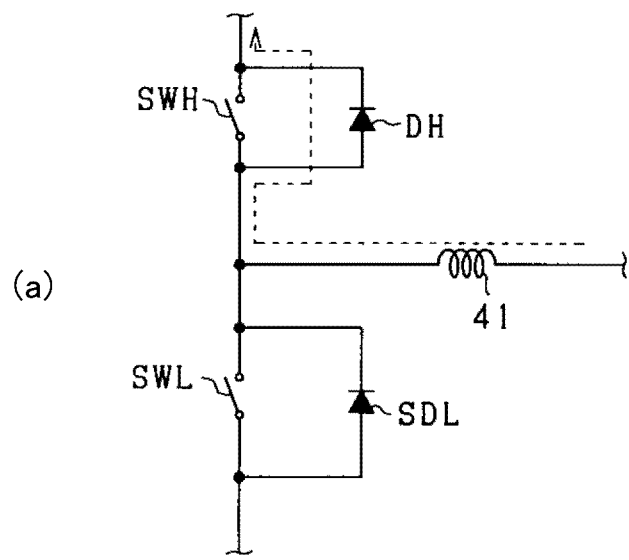
(a)
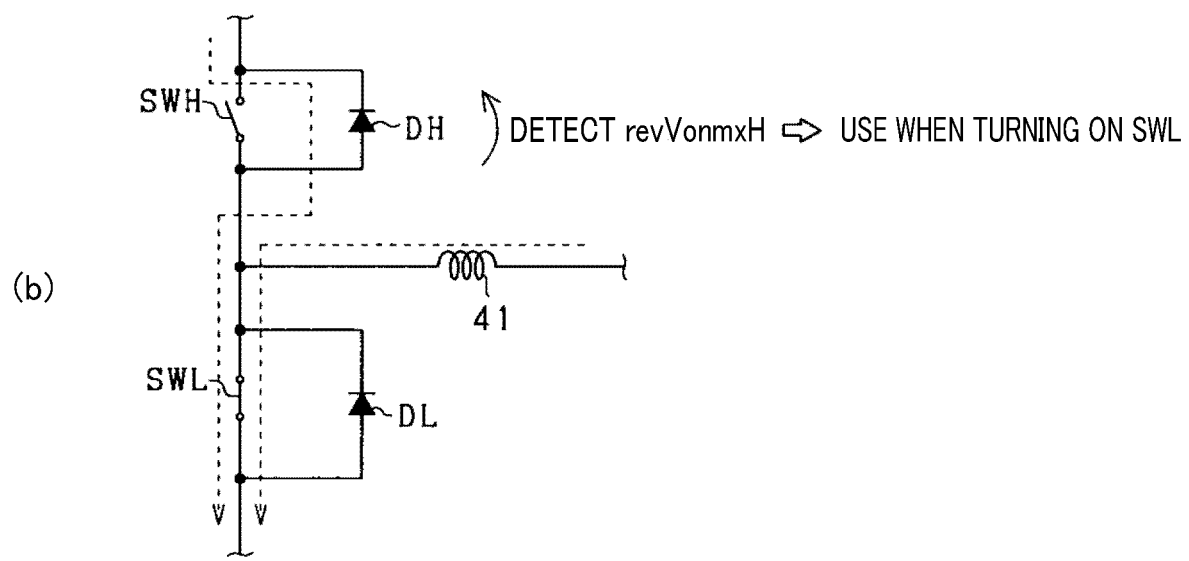
(b)

FIG.20
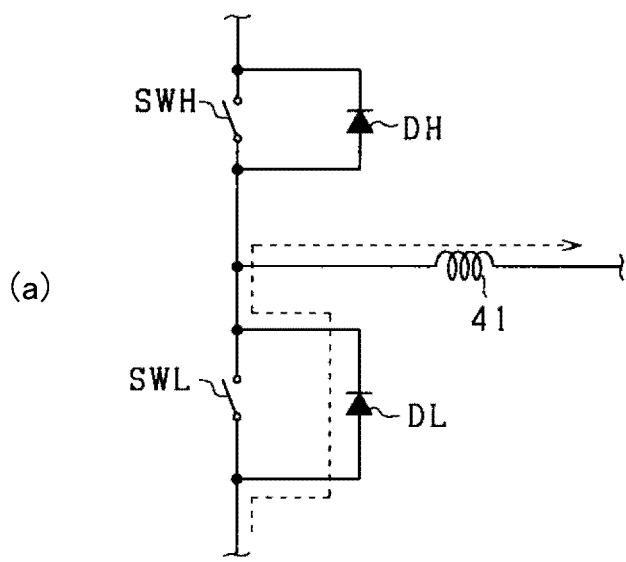
(a)
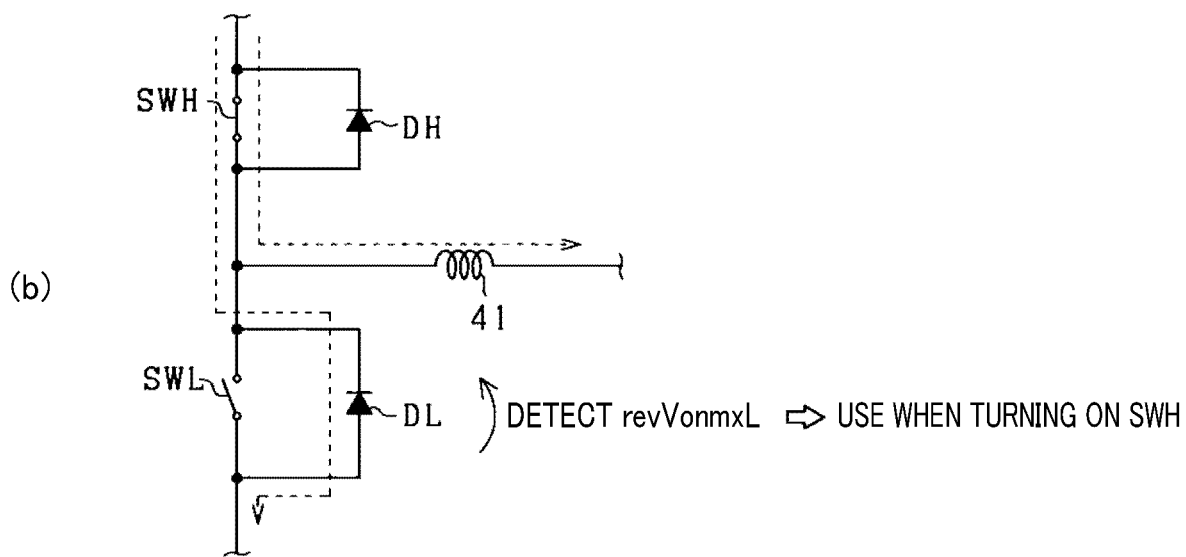
(b) DETECT revVonmxL ⇒ USE WHEN TURNING ON SWH

DRIVE DEVICE FOR SWITCH

CROSS-REFERENCE TO RELATED APPLICATION

The present application is based on and claims the benefit of priority from earlier Japanese Patent Application No. 2018-159564 filed on Aug. 28, 2018, the description of which is incorporated herein by reference.

BACKGROUND

Technical Field

The present disclosure relates to a drive device for a switch, the drive device performing switching of switches configuring an electrical power converter.

Related Art

As this type of device, a configuration is disclosed which includes a drive circuit that receives an externally generated drive signal for a switch and performs switching of the switch based on the received drive signal. This drive circuit detects a voltage between the terminals of the switch and a current flowing to the switch and performs so-called active gate control that adjusts a gate current of the switch based on the detection results.

SUMMARY

As an aspect of the present disclosure, a drive device for a switch is provided. The drive device performs switching of at least one switch configuring an electrical power converter. The drive device includes: a control section that generates a drive signal for the switch and transmits the drive signal; and at least one drive circuit that receives the transmitted drive signal. The control section generates speed adjustment information for adjusting a switching speed of the switch and transmits the speed adjustment information to the drive circuit. The drive circuit includes: a speed calculation section that receives the transmitted speed adjustment information and calculates command switching speed information of the switch based on the received speed adjustment information; and a drive section that performs switching of the switch based on the received drive signal and the calculated command switching speed information.

BRIEF DESCRIPTION OF THE DRAWINGS

In the accompanying drawings:

FIG. 10 is a timing diagram illustrating changes of a drive signal and the like;

FIG. 19 is a diagram illustrating a state in which a recovery current flows when a lower arm switch is changed to an on state according to a sixth embodiment;

FIG. 20 is a diagram illustrating a state in which a recovery current flows when an upper arm switch is changed to an on state;

DETAILED DESCRIPTION OF THE PREFERRED EMBODIMENTS

As this type of device, JP 2007-221863 A discloses a configuration including a drive circuit that receives an externally generated drive signal for a switch and performs switching of the switch based on the received drive signal. This drive circuit detects a voltage between the terminals of the switch and a current flowing to the switch and performs so-called active gate control that adjusts a gate current of the switch based on the detection results. Hence, the switching speed of the switch is adjusted to an appropriate speed to reduce switching loss while suppressing a surge voltage generated due to a change in the switching state.

In an electrical power converter, a voltage between the terminals of a switch and a current flowing to the switch are likely to vary suddenly. Hence, under a method in which a drive circuit detects a voltage between the terminals and a current, and a gate current of a switch is adjusted based on the detection result, when a switching state of the switch is changed, the switching speed may greatly deviate from an appropriate speed that provides an effect of suppressing a surge voltage and an effect of reducing switching loss. In this case, the effect of suppressing a surge voltage may decrease, so that the voltage between the terminals of the switch exceeds the withstand voltage thereof, or the effect of reducing switching loss may decrease.

The present disclosure aims to provide a drive device for a switch which can prevent an effect of suppressing a surge voltage and an effect of reducing switching loss from decreasing when the switch is changed to an off state.

First Embodiment

Hereinafter, the first embodiment of a drive device according to the present disclosure will be described with reference to the drawings. The drive device is applied to a DCDC converter and a three-phase inverter serving as an electrical power converter. In the present embodiment, a control system including the drive device and the electrical power converter are installed in a vehicle such as an electrical vehicle or a hybrid vehicle.

Figure 1:
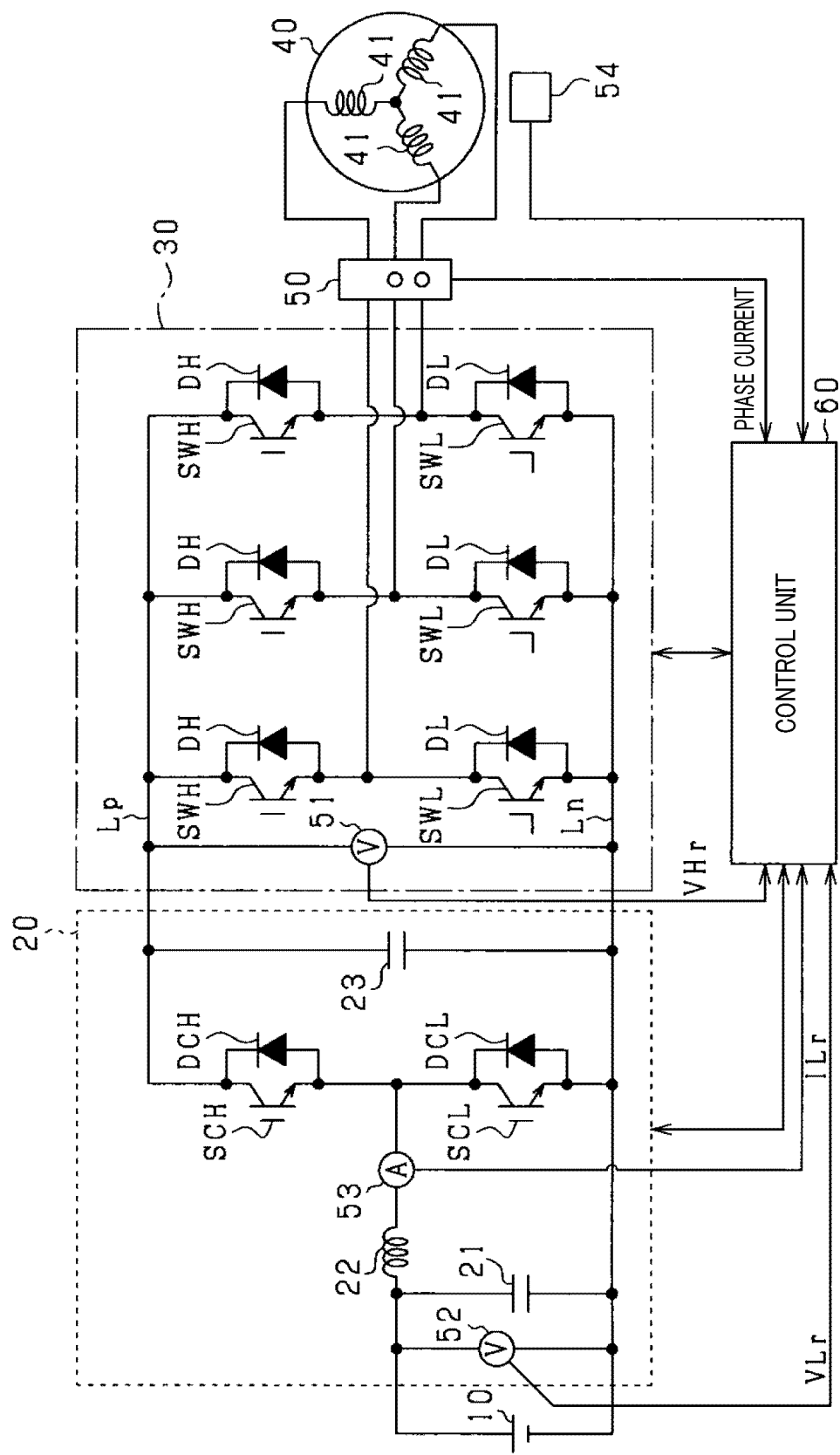
FIG. 1 is a drawing of the overall configuration of a control system for a rotary electric machine according to a first embodiment.

As shown in FIG. 1, the control system includes a DCDC converter 20, an inverter 30, a rotary electric machine 40, and a control unit 60. The rotary electric machine 40 is, for example, an in-vehicle traction unit and includes a rotor. The rotor can transmit power to drive wheels. The rotary electric machine 40 is, for example, a synchronous machine.

Each phase winding 41 of the rotary electric machine 40 is connected with a storage battery 10 serving as a DC power supply via the inverter 30 and the DCDC converter 20. The DCDC converter 20 includes a first capacitor 21, a reactor 22, a second capacitor 23, an upper arm transformation switch SCH, and a lower arm transformation switch SCL. The DCDC converter 20 has a step-up function of increasing the voltage of the storage battery 10 and outputting the voltage to the inverter 30 and a step-down function of decreasing the voltage generated by the rotary electric machine 40 and received through the inverter 30 and outputting the voltage to the storage battery 10. In the present embodiment, each of the transformation switches SCH, SCL is a voltage control type semiconductor switching element, specifically, an IGBT. The upper and lower arm transformation switches SCH, SCL are connected with upper and lower arm transformation diodes DCH, DCL, which are free wheel diodes, in antiparallel.

The collector of the upper arm transformation switch SCH is connected with a positive-electrode bus Lp. The emitter of the upper arm transformation switch SCH is connected with the collector of the lower arm transformation switch SCL. The emitter of the lower arm transformation switch SCL is connected with a negative-electrode bus Ln. Each of the buses Lp, Ln is configured by, for example, a bus bar.

A series connection of the upper arm transformation switch SCH and the lower arm transformation switch SCL is connected with the second capacitor 23 in parallel. A connection point between the upper arm transformation switch SCH and the lower arm transformation switch SCL is connected with a first terminal of the reactor 22. A second terminal of the reactor 22 is connected with a first terminal of the first capacitor 21 and a positive-electrode terminal of the storage battery 10. A negative-electrode terminal of the storage battery 10 and a second terminal of the first capacitor 21 are connected with the negative-electrode bus Ln.

The inverter 30 includes three-phase series connections of an upper arm switch SWH and a lower arm switch SWL. In the present embodiment, each of the switches SWH, SWL is a voltage control type semiconductor switching element, specifically, an IGBT. The upper and lower arm switches SWH, SWL are connected with upper and lower arm diodes DH, DL, which are free wheel diodes, in antiparallel. In each of the phases, a connection point of the upper and lower arm switches SWH, SWL is connected with a first end of the winding 41. A second end of the winding 41 of each of the phases is connected with each other at a neutral point. The winding 41 of each of the phases is displaced 120 electrical degrees from each other.

The control system includes a phase current sensor 50, a first voltage sensor 51, a second voltage sensor 52, a reactor current sensor 53, and an angle sensor 54. The phase current sensor 50 detects at least two-phase currents of phase currents flowing to the rotary electric machine 40. The first voltage sensor 51 detects a voltage between the terminals of the second capacitor 23 as an input voltage VHr of the inverter 30. The second voltage sensor 52 detects a voltage between the terminals of the first capacitor 21 as an input voltage VLr of the DCDC converter 20. The reactor current sensor 53 detects a current flowing to the reactor 22. The angle sensor 54 is, for example, a resolver and detects an electrical angle of the rotary electric machine 40. Detection values of the sensors 50 to 54 are input to the control unit 60.

The control unit 60 is mainly configured by a microcomputer and drives the upper arm transformation switch SCH and the lower arm transformation switch SCL to control a power-supply voltage VHr detected by the first voltage sensor 51 so as to be a target voltage VH*. The control unit 60 outputs drive signals for the upper and lower arm transformation switches SCH, SCL to drive circuits included in the DCDC converter 20. In the present embodiment, the drive circuits are individually provided for the upper and lower arm transformation switches SCH, SCL. The drive signal indicates an on command instructing the switch to change to an on state or an off command instructing the switch to change to an off state.

The control unit 60 calculates a target time ratio Duty by, for example, feedforward computation based on a deviation between the power-supply voltage VHr and the target voltage VH* and feedforward computation based on a ratio between the input voltage VLr and the target voltage VH*. The target time ratio Duty is a ratio of an on time period Ton to one switching time period Tsw of each of the switches SCH, SCL (=Ton/Tsw). The control unit 60 generates drive signals for the upper and lower arm transformation switches SCH, SCL based on the calculated target time ratio Duty. The drive signals are generated so as to turn on the upper and lower arm transformation switches SCH, SCL alternately with a dead time therebetween.

The control unit 60 operates the switches SWH, SWL of the inverter 30 to control a controlled variable of the rotary electric machine 40 so as to be a target value thereof. The controlled variable is, for example, torque. The control unit 60 outputs drive signals for the upper and lower arm switches SWH, SWL in each of the phases to the drive circuits included in the inverter 30 so as to turn on the upper and lower arm switches SWH, SWL alternately with a dead time therebetween. In the present embodiment, the drive circuits are individually provided for the arms of each of the phases.

Figure 2:
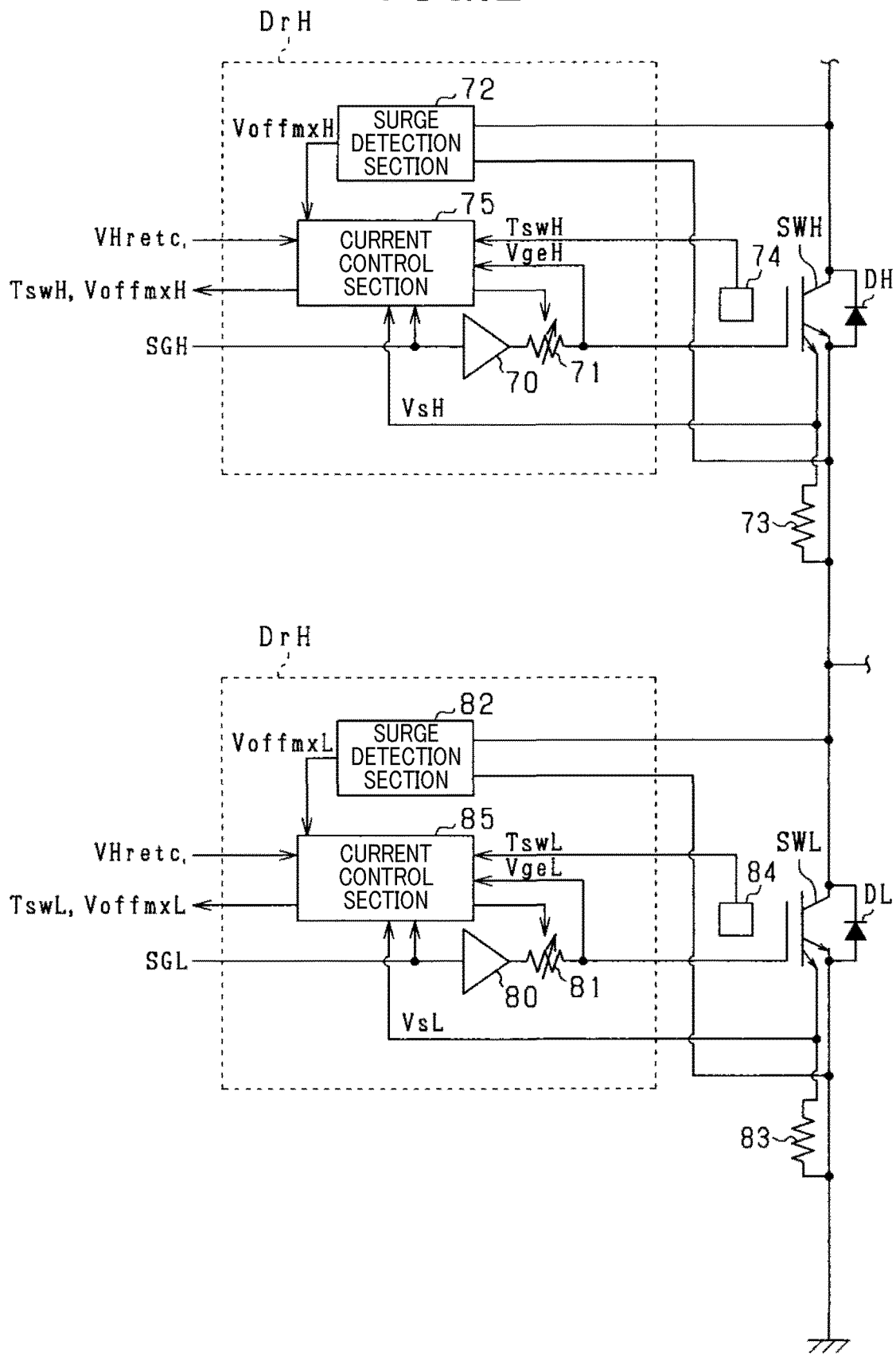
FIG. 2 is a drawing showing a configuration of a drive circuit.

Next, the configuration of the drive circuit will be described with reference to FIG. 2. In the present embodiment, the drive circuits for the upper and lower arms of the inverter 30 and the drive circuits for the upper and lower arm transformation switches SCH, SCL of the DCDC converter 20 have basically similar configurations. Hence, hereinafter, the drive circuit of the inverter 30 will be described as an example. Functions of the control unit 60 and the drive circuit can be provided by, for example, software stored in a tangible memory device and a computer executing the software, hardware, or the combination thereof.

First, an upper arm drive circuit DrH will be described. The upper arm drive circuit DrH includes an upper arm buffer circuit 70 and an upper arm resistor 71. The upper arm resistor 71 is a gate resistor. The resistance value of the upper arm resistor 71 is variable. The upper arm buffer circuit 70 receives an upper arm drive signal SGH from the control unit 60. If the received upper arm drive signal SGH is an on command, the upper arm buffer circuit 70 supplies charging current to the gate of the upper arm switch SWH through the upper arm resistor 71. Hence, the gate voltage of the upper arm switch SWH becomes a threshold voltage Vth or more, whereby the upper arm switch SWH is turned on. In contrast, if the received upper arm drive signal SGH is an off command, the upper arm buffer circuit 70 releases discharge current from the gate of the upper arm switch SWH through the upper arm resistor 71. Hence, the gate voltage of the upper arm switch SWH becomes less than the threshold voltage Vth, whereby the upper arm switch SWH is turned off. In the present embodiment, the upper arm buffer circuit 70 and the upper arm resistor 71 correspond to a drive section of the upper arm drive circuit DrH.

The upper arm drive circuit DrH includes an upper arm surge detection section 72 and an upper arm current control section 75. The upper arm surge detection section 72 detects a surge voltage generated due to the change to an off state of the upper arm switch SWH. Specifically, the upper arm surge detection section 72 detects a peak value of the surge voltage as an upper arm peak value VoffmxH (refer to FIG. 5). The upper arm surge detection section 72 may include, for example, an amplifier circuit using an operational amplifier. The upper arm peak value VoffmxH detected by the upper arm surge detection section 72 is input to the upper arm current control section 75. The upper arm surge detection section 72 is not limited to the above configuration but may include a series connection of a pair of capacitors connected to the upper arm switch SWH in parallel or a series connection of a pair of resistors connected to the upper arm switch SWH in parallel.

A sense terminal of the upper arm switch SWH is connected with the emitter of the upper arm switch SWH via an upper arm sense resistor 73. Hence, the difference in potential depending on a collector current flowing to the upper arm switch SWH is generated in the upper arm sense resistor 73 (hereinafter, upper arm sense voltage VsH). The upper arm sense voltage VsH is input to the upper arm current control section 75.

The upper arm current control section 75 receives a temperature of the upper arm switch SWH detected by an upper arm temperature sensor 74 (hereinafter, upper arm switch temperature TswH). The upper arm temperature sensor 74 may include, for example, a temperature-sensitive diode. The upper arm current control section 75 receives a gate voltage of the upper arm switch SWH (hereinafter, upper arm gate voltage VgeH).

Next, a lower arm drive circuit DrL will be described. In the present embodiment, the configuration of the lower arm drive circuit DrL is basically the same as the configuration of the upper arm drive circuit DrH. Hence, the lower arm drive circuit DrL will be described with appropriate omission.

The lower arm drive circuit DrL includes a lower arm buffer circuit 80 and a lower arm resistor 81. The resistance value of the lower arm resistor 81 is variable. The lower arm buffer circuit 80 receives a lower arm drive signal SGL from the control unit 60. If the received lower arm drive signal SGL is an on command, the lower arm buffer circuit 80 supplies charging current to the gate of the lower arm switch SWL through the lower arm resistor 81. Hence, the lower arm switch SWL is turned on. In contrast, if the received lower arm drive signal SGH is an off command, the lower arm buffer circuit 80 releases discharge current from the gate of the lower arm switch SWL through the lower arm resistor 81. Hence, the lower arm switch SWL is turned off. In the present embodiment, the lower arm buffer circuit 80 and the lower arm resistor 81 correspond to a drive section of the lower arm drive circuit DrL.

The lower arm drive circuit DrL includes a lower arm surge detection section 82 and a lower arm current control section 85. The lower arm surge detection section 82 detects, as a lower arm peak value VoffmxL, a peak value of a surge voltage generated due to the change to an off state of the lower arm switch SWL. The lower arm peak value VoffmxL detected by the lower arm surge detection section 82 is input to the lower arm current control section 85.

A sense terminal of the lower arm switch SWL is connected with the emitter of the lower arm switch SWL via a lower arm sense resistor 83. Hence, the difference in potential depending on a collector current flowing to the lower arm switch SWL (hereinafter, lower arm sense voltage VsL) is generated in the lower arm sense resistor 83. The lower arm sense voltage VsL is input to the lower arm current control section 85.

The lower arm current control section 85 receives a temperature of the lower arm switch SWL detected by a lower arm temperature sensor 84 (hereinafter, lower arm switch temperature TswL). The lower arm current control section 85 receives a gate voltage of the lower arm switch SWL (hereinafter, lower arm gate voltage VgeL).

Figure 3:
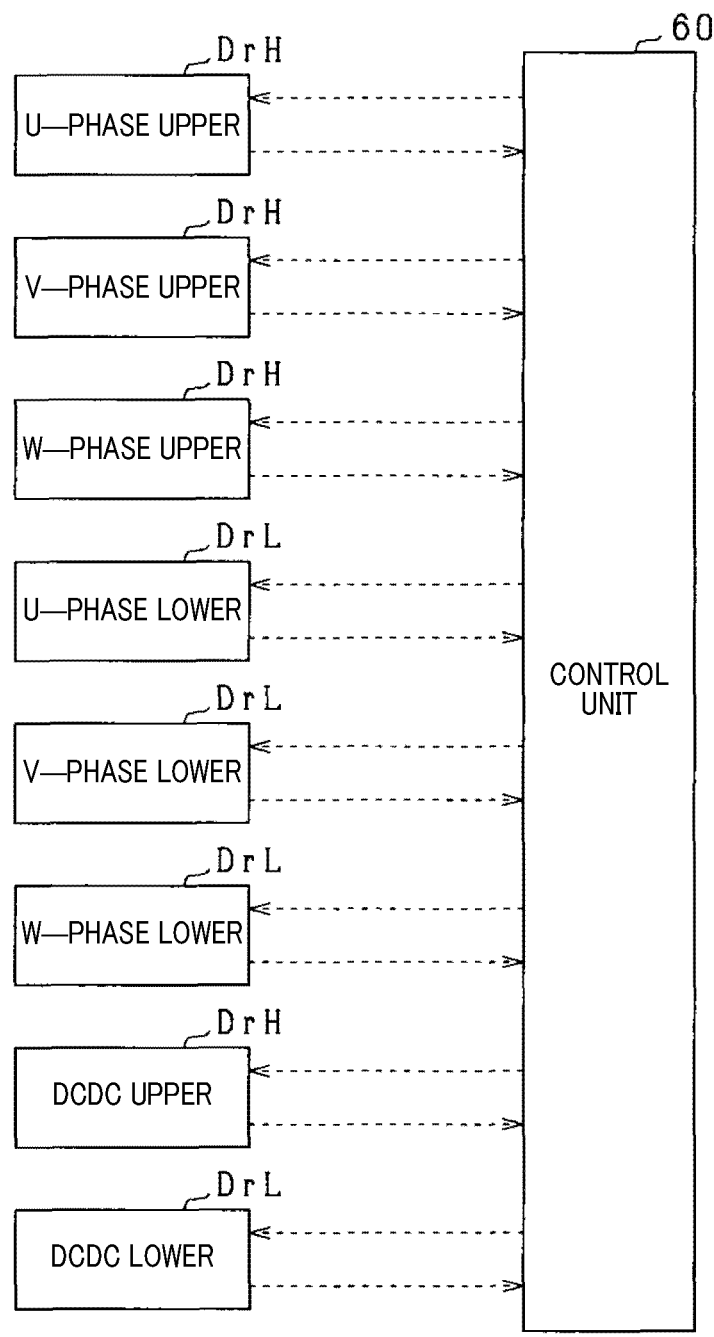
FIG. 3 is a drawing illustrating a communication state between a control unit and each drive circuit.

FIG. 3 illustrates a communication state between the control unit 60, and the drive circuits DrH, DrL of the inverter 30 and the drive circuits DrH, DrL of the DCDC converter 20. Communication lines are individually provided between the control unit 60, and the upper arm drive circuit DrH of each of the phases and the lower arm drive circuit DrL of each of the phases. Hence, the control unit 60, and the drive circuits DrH, DrL of the inverter 30 and the drive circuits DrH, DrL of the DCDC converter 20 can transmit information to each other. As a communication means, any means, for example, SPI (registered trademark), CAN, UART, Ethernet (registered trademark), and parallel communication can be used. Communication may be established by, for example, binary digital signals or Duty signals.

Information transmitted from the control unit 60 to the drive circuits DrH, DrL includes a drive signal, the power-supply voltage VHr, and phase current information detected by the phase current sensor 50. Information transmitted from the drive circuits DrH, DrL to the control unit 60 includes the upper and lower arm switch temperatures TswH, TswL and the upper and lower arm peak values VoffmxH, VoffmxL.

The control unit 60 is provided in a low-voltage system. In contrast, the storage battery 10, the DCDC converter 20, the inverter 30, and the rotary electric machine 40 are provided in a high-voltage system electrically insulated from the low-voltage system. Hence, information communication between the control unit 60 and the drive circuits DrH, DrL is performed through an isolating transmission section. The isolating transmission section is an electronic component for transmitting information from one of the low-voltage system and the high-voltage system to the other of the low-voltage system and the high-voltage system while electrically insulating the low-voltage system and the high-voltage system from each other. As the isolating transmission section, for example, a photo coupler or a magnetic coupler is used.

Figure 4:
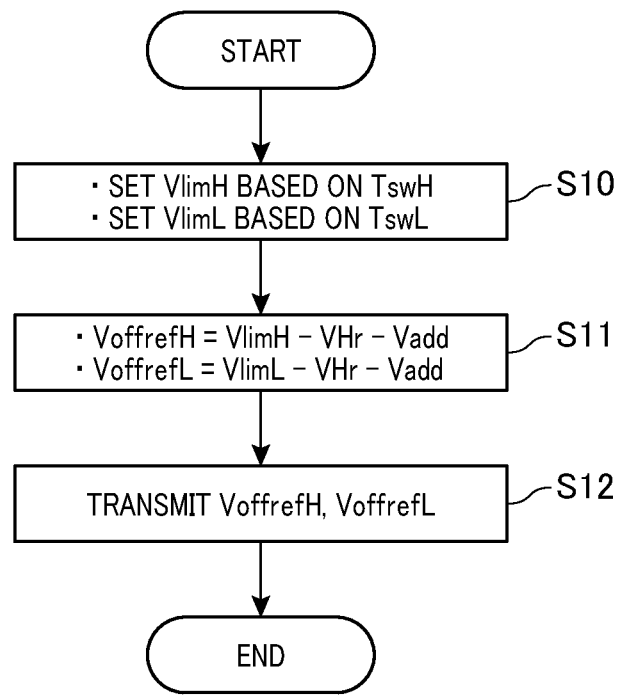
FIG. 4 is a flowchart illustrating a procedure of a process performed by the control unit.

FIG. 4 illustrates a procedure of a process performed by the control unit 60. This process is repeatedly performed, for example, at predetermined control intervals. In the present embodiment, the control unit 60 corresponds to a control section.

In step S10, the control unit 60 receives the upper and lower arm switch temperatures TswH, TswL transmitted from the upper and lower arm drive circuits DrH, DrL. Then, the control unit 60 sets an upper arm withstand voltage VlimH, which is an allowable upper limit value of a voltage VceH between the collector and the emitter of the upper arm switch SWH, based on the received upper arm switch temperature TswH. In addition, the control unit 60 sets a lower arm withstand voltage VlimL, which is an allowable upper limit value of a voltage VceL between the collector and the emitter of the lower arm switch SWL, based on the received lower arm switch temperature TswL. The process in step S10 considers that the withstand voltage VlimH, VlimL have temperature dependencies. In the present embodiment, as the upper arm switch temperature TswH is lower, the upper arm withstand voltage VlimH is set to be lower. As the lower arm switch temperature TswL is lower, the lower arm withstand voltage VlimL is set to be lower.

Figure 5:
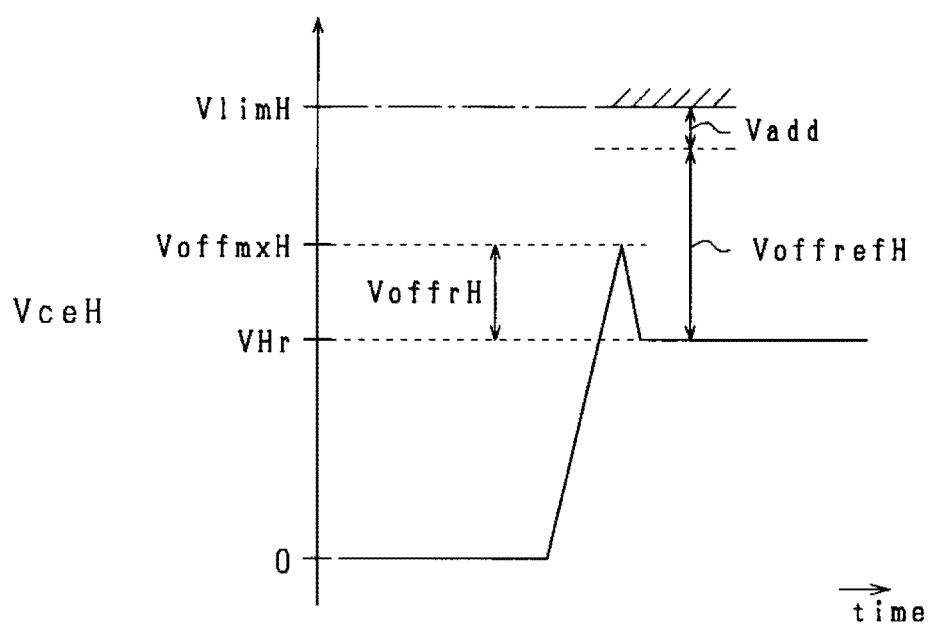
FIG. 5 is a timing diagram illustrating a method of calculating a surge reference value.

In step S11, as shown in FIG. 5, the control unit 60 subtracts an additional value of the power-supply voltage VHr and a superimposed surge Vadd from the upper arm withstand voltage value VlimH to calculate an upper arm off voltage command value VoffrefH. In addition, the control unit 60 subtracts an additional value of the power-supply voltage VHr and the superimposed surge Vadd from the lower arm withstand voltage value VlimL to calculate a lower arm off voltage command value VoffrefL. In the present embodiment, the upper arm off voltage command value VoffrefH and the lower arm off voltage command value VoffrefL correspond to speed adjustment information and a surge reference value.

The superimposed surge Vadd is a value larger than 0. For example, the superimposed surge Vadd may be a value corresponding to the influence of a surge voltage due to switching in another phase or a value of a predetermined ratio (e.g., 10%) of a surge voltage due to switching in the own phase. The superimposed surge Vadd may include a margin due to a measuring error of a sensor or the like.

It is noted that, instead of the power-supply voltage VHr, the target voltage VH* may be used to set the withstand voltage values VlimH, VlimL.

The superimposed surge Vadd may be 0. When the superimposed surge Vadd can be 0, a control mode of the rotary electric machine 40 is not necessary to consider the influence of a surge voltage due to switching in another phase. The control mode is, for example, a rectangular wave control mode. In the rectangular wave control mode, since a switching state in each of the phases is sequentially changed at every electrical angle of 60°, the influence of a surge voltage due to switching in another phase is not necessary to consider. When selectable control modes, such as sinusoidal wave PWM control, overmodulation PWM control, and rectangular wave control, are related to the power-supply voltage VHr and a rotational speed of the rotary electric machine 40, a current control mode may be determined based on the power-supply voltage VHr and the rotational speed. Herein, the rotational speed may be calculated based on detection values of the angle sensor 54.

In step S12, the control unit 60 transmits the calculated upper arm off voltage command value VoffrefH to the upper arm drive circuit DrH, and transmits the calculated lower arm off voltage command value VoffrefL to the lower arm drive circuit DrL.

Also for the upper and lower arm transformation switches SCH, SCL of the DCDC converter 20, the upper and lower arm off voltage command values VoffrefH, VoffrefL are calculated by a method similar to the method illustrated in FIG. 4. Then, the calculated upper and lower arm off voltage command values VoffrefH, VoffrefL are transmitted to the upper and lower arm drive circuits DrH, DrL corresponding to the upper and lower arm transformation switches SCH, SCL. Hereinafter, the drive circuits DrH, DrL of the inverter 30 will be described as an example. However, a case of the drive circuits DrH, DrL of the DCDC converter 20 is similar to the case of the inverter 30.

Figure 6:
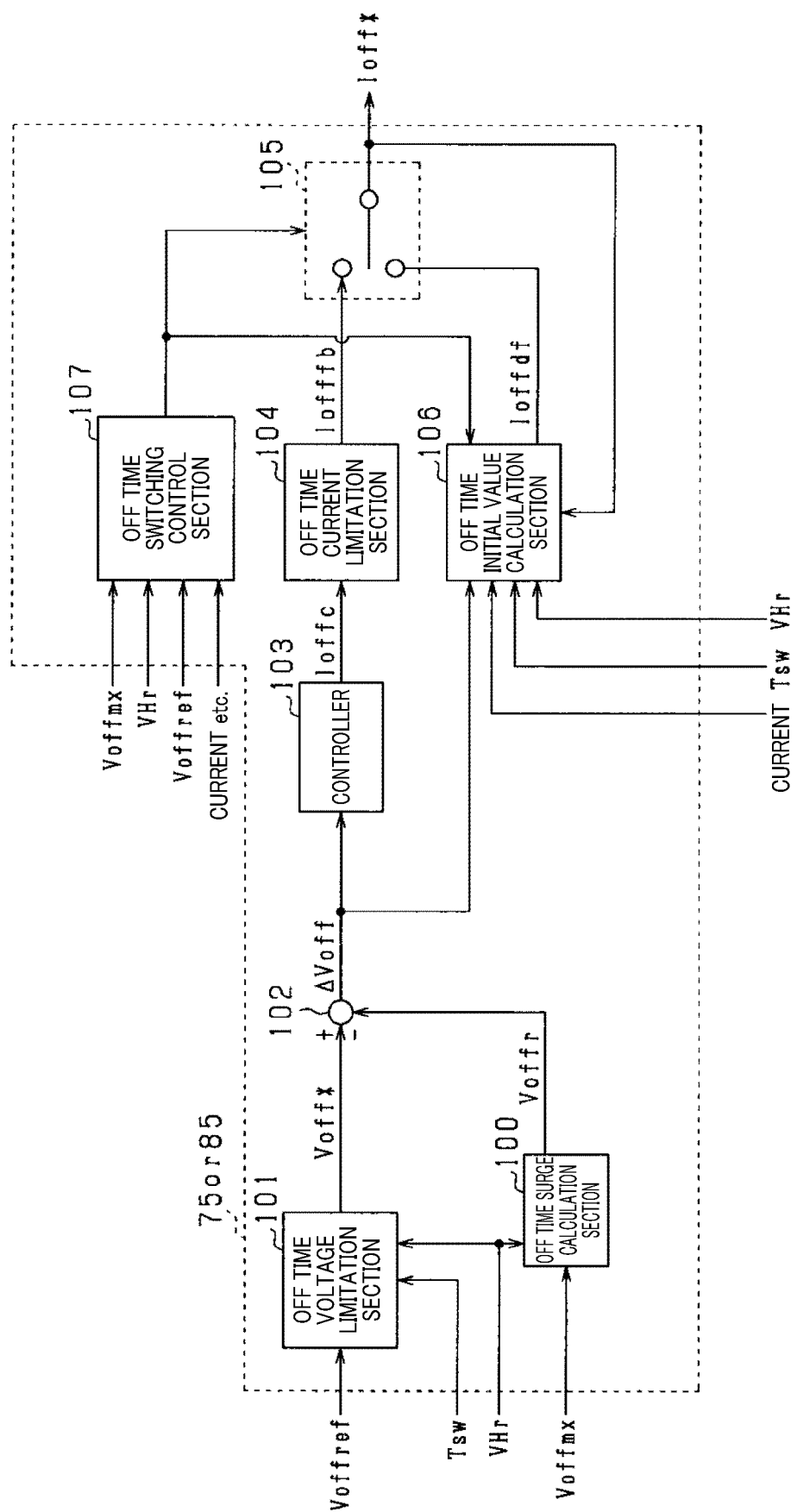
FIG. 6 is a block diagram of a process performed by a current control section.

FIG. 6 is a block diagram of a process performed by the upper and lower arm current control sections 75, 85 of the upper and lower arm drive circuits DrH, DrL. In the present embodiment, basically the same process is performed by the upper and lower arm current control sections 75, 85. Hence, hereinafter, the upper and lower arm off voltage command values VoffrefH, VoffrefL are simply referred to as an off voltage command value Voffref, the upper and lower arm switch temperatures TswH, TswL are simply referred to as a switch temperature Tsw, the upper and lower arm peak values VoffmxH, VoffmxL are simply referred to as a peak value Voffmx, and the upper and lower arm withstand voltages VlimH, VlimL are simply referred to as a withstand voltage Vlim. The upper and lower arm switches SWH, SWL are simply referred to as a switch.

As shown in FIG. 5, an off time surge calculation section 100 subtracts the power-supply voltage VHr received from the control unit 60 from the peak value Voffmx to calculate an off surge value Voffr.

An off time voltage limitation section 101 calculates a limit value Vofflim of the off voltage command value Voffref based on the switch temperature TswH and the power-supply voltage VHr. If the received off voltage command value Voffref is the limit value Vofflim or less, the off time voltage limitation section 101 sets the received off voltage command value Voffref as an off surge command value Voff*. In contrast, if the received off voltage command value Voffref is more than the limit value Vofflim, the off time voltage limitation section 101 sets the limit value Vofflim as an off surge command value Voff*. In the present embodiment, the off time voltage limitation section 101 corresponds to an adjustment information limitation section.

The off time voltage limitation section 101 calculates the limit value Vofflim by the same method as in steps S10, S11 in FIG. 4. That is, the switch temperature Tsw, the power-supply voltage VHr, and the superimposed surge Vadd provide the same limit value Vofflim and off voltage command value Voffref. Specifically, the off time voltage limitation section 101 first sets the withstand voltage Vlim based on the switch temperature Tsw. The off time voltage limitation section 101 subtracts an additional value of the power-supply voltage VHr and the superimposed surge Vadd from the set withstand voltage value Vlim to calculate the limit value Vofflim.

An off voltage deviation calculation section 102 subtracts the off surge value Voffr calculated by the off time surge calculation section 100 from the off surge command value Voff* set by the off time voltage limitation section 101 to calculate an off voltage deviation ΔVoff.

An off time controller 103 calculates an off time discharge current Ioffc, which is a command value for a discharge current released from the gate of a switch, as an operation amount for feedback control of the calculated off voltage deviation ΔVoff to 0. In the present embodiment, the off time controller 103 calculates the off time discharge current Ioffc by proportional-integral control based on the off voltage deviation ΔVoff. In the present embodiment, the off time discharge current Ioffc corresponds to command switching speed information. As the off time discharge current Ioffc is larger, the switching speed when a switch is changed to an off state becomes higher. In the present embodiment, the off time surge calculation section 100, the off voltage deviation calculation section 102, and the off time controller 103 correspond to a speed calculation section.

Figure 7:
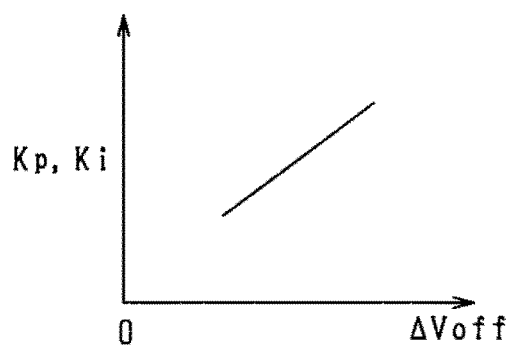
FIG. 7 is a drawing illustrating a method of setting a feedback gain.

In the present embodiment, the off time controller 103 sets a proportional gain Kp and an integral gain Ki used for the proportional-integral control so as to be larger in a case in which the off voltage deviation ΔVoff (specifically, the absolute value of the off voltage deviation ΔVoff) is large than in a case in which the off voltage deviation ΔVoff is small. Specifically, as shown in FIG. 7, the off time controller 103 sets the proportional gain Kp and the integral gain Ki larger as the off voltage deviation ΔVoff is larger.

Only one of the proportional gain Kp and the integral gain Ki may be set larger as the off voltage deviation ΔVoff is larger. The feedback control by the off time controller 103 may include differential control. In this case, a differential gain Kd may be set larger in a case in which the off voltage deviation ΔVoff is large than in a case in which the off voltage deviation ΔVoff is small.

If the off time discharge current Ioffc calculated by the off time controller 103 is a discharge limitation current Iofflim or less, an off time current limitation section 104 sets the calculated off time discharge current Ioffc as a feedback off current Iofffb. In contrast, if the off time discharge current Ioffc is more than the discharge limitation current Iofflim, the off time current limitation section 104 sets the discharge limitation current Iofflim as the feedback off current Iofffb. In the present embodiment, the off time current limitation section 104 corresponds to a command information limitation section.

The discharge limitation current Iofflim is determined under the constraint that the switch has not failed and the constraint that the drive circuit has not failed. The constraint that the switch has not failed is, for example, the constraint that the time rate of change between the collector and the emitter of the switch is the allowable upper limit value or less.

A command discharge current setting section 105 sets the feedback off current Iofffb calculated by the off time current limitation section 104 or an off current initial value Ioffdf calculated by an off time initial value calculation section 106 described later, to a command discharge current Ioff* to be released from the gate of the switch. For example, when the upper arm switch SWH is changed to an off state, the upper arm current control section 75 adjusts a resistance value of the upper arm resistor 71 so that an actual discharge current of the upper arm switch SWH becomes the command discharge current Ioff*.

The off time initial value calculation section 106 calculates the off current initial value Ioffdf based on the switch temperature Tsw, the power-supply voltage VHr and the collector current, and map information in which the off current initial value Ioffdf is defined in association with the switch temperature Tsw, and the power-supply voltage VHr and the collector current (corresponding to definition information). When the off voltage deviation ΔVoff is 0, the off current initial value Ioffdf is smaller than the off time discharge current Ioffc calculated by the off time controller 103. As the collector current, for example, a detection value of the phase current sensor 50, a sense voltage Vs, or a current command value may be used. The map information is stored in a storage section, such as a memory, included in the drive circuit. The memory is a non-transitory tangible recording medium other than a ROM (e.g., a non-volatile memory other than a ROM).

An off time switching control section 107 determines whether the feedback off current Iofffb is set as the command discharge current Ioff* or the off current initial value Ioffdf calculated by the off time initial value calculation section 106 is set as the command discharge current Ioff*. In the present embodiment, the command discharge current setting section 105 and the off time switching control section 107 correspond to a switching section.

Figure 8:
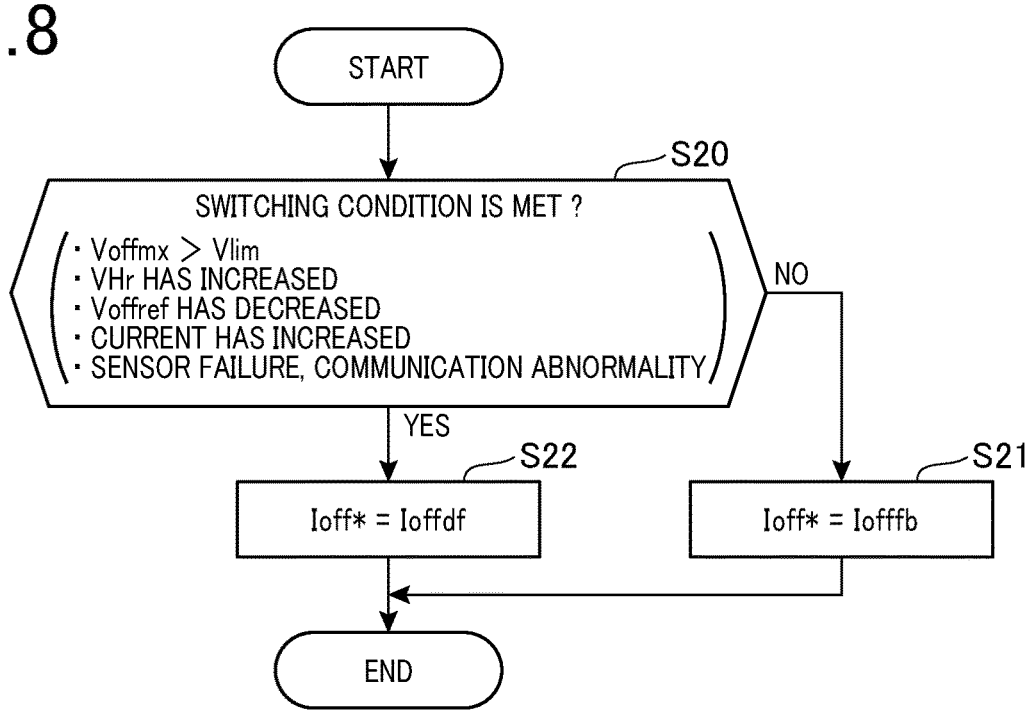
FIG. 8 is a flowchart illustrating a procedure of a process performed by a switching control section.

FIG. 8 illustrates a procedure of a process performed by the off time switching control section 107. This process is repeatedly performed, for example, at predetermined control intervals. The control interval may be the same as the control interval of the control unit 60 or different from the control interval of the control unit 60.

In step S20, the off time switching control section 107 determines whether a switching condition is met. The switching condition is a condition for determining that the off current initial value Ioffdf, not the feedback off current Iofff, is required to be set as the command discharge current Ioff*.

In step S20, if it is determined that the switching condition is not met, the process proceeds to S21 in which the off time switching control section 107 switches the command discharge current setting section 105 so that the feedback off current Iofffb is set to the command discharge current Ioff*. In contrast, if it is determined that the switching condition is met in step 20, the process proceeds to S22 in which the off time switching control section 107 switches the command discharge current setting section 105 so that the off current initial value Ioffdf is set to the command discharge current Ioff*.

In the present embodiment, the switching condition in step S20 includes the following conditions (A) to (E). If any of the conditions (A) to (E) is met, an affirmative determination is made in step S20.

(A) The condition that the peak value Voffmx has exceeded the withstand voltage Vlim. If this condition is met, the off current initial value Ioffdf is set to the command discharge current Ioff*. Hence, the switching speed can be lowered, and thereafter the peak value Voffmx can be prevented from exceeding the withstand voltage Vlim.

A margin may be provided to a threshold value to be compared with the peak value Voffmx to change the condition (A) to the condition that the peak value Voffmx has exceeded a determination value smaller than the withstand voltage Vlim.

(B) The condition that the power-supply voltage VHr has increased. If the power-supply voltage VHr increases, the voltage between the collector and the emitter of the switch may exceed the withstand voltage Vlim. Hence, if the condition (B) is met, the switching speed is lowered to perform the control safely.

The condition (B) may be a condition that the power-supply voltage VHr has increased by a predetermined value. In this case, the predetermined value may be made smaller as the power-supply voltage VHr is higher. In the condition (B), instead of the power-supply voltage VHr, which is a detection value, the target voltage VH* may be used.

(C) The condition that the off voltage command value Voffref has decreased. If the off voltage command value Voffref decreases, a voltage between the collector and the emitter of the switch may exceed the withstand voltage VlimL. Hence, the condition (C) is provided as the switching condition.

(D) The condition that the collector current flowing to the switch has increased. If the collector current increases, a surge voltage generated when the switch is changed to an off state increases. Hence, the condition (D) is provided as the switching condition. As the collector current, for example, a current amplitude in one period of the electrical angle or an instantaneous value of the collector current may be used. The collector current may be determined based on a detection value of the phase current sensor 50, a detection value of the sense voltage Vs or the like, or a current command value calculated during the control for the rotary electric machine 40 (e.g., d, q axis command value).

(E) The condition that any of the sensors 50 to 54 has failed or a communication abnormality has occurred from the control unit 60.

If the absolute value of the off voltage deviation ΔVoff is a predetermined value or more, even if the condition (B) or (D) is met, an affirmative determination may be not made in step S20.

A means that can transmit information from the control unit 60 to the drive circuit at high speed may be used to output a command for switching to the off current initial value Ioffdf from the control unit 60. In this case, the command may be a binary signal of Hi/Lo or a pulse signal. In the case of a pulse signal, a failure such as disconnection of a signal path can be handled.

Figure 9:
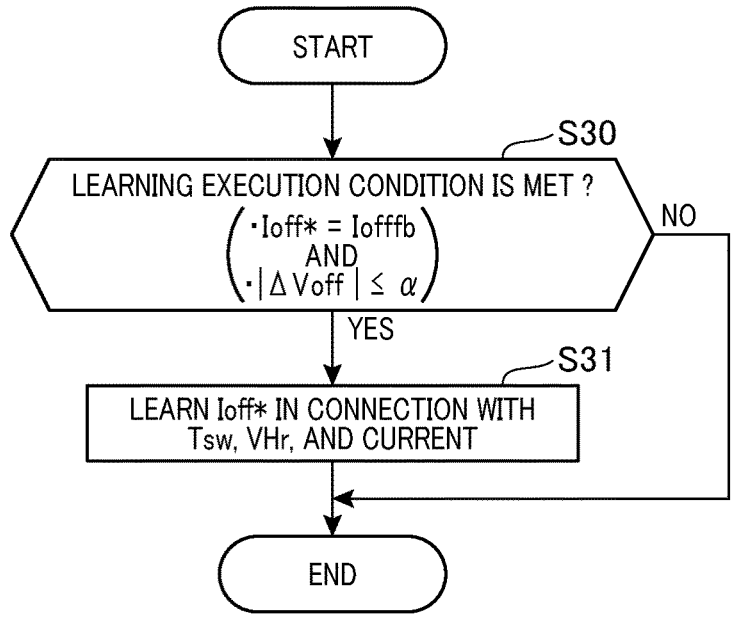
FIG. 9 is a flowchart illustrating a procedure of a learning process.

The off time initial value calculation section 106 performs a learning process illustrated in FIG. 9. This process is repeatedly performed, for example, at predetermined control intervals. The control interval may be the same as the control interval of the control unit 60 or different from the control interval of the control unit 60.

In step S30, the off time initial value calculation section 106 determines whether a learning execution condition has been met. In the present embodiment, if it is determined that a first condition that the feedback off current Iofffb, not the off current initial value Ioffdf, is set to the command discharge current Ioff* and a second condition that the absolute value of the off voltage deviation ΔVoff is a threshold value a or less are both met, the off time initial value calculation section 106 determines that the learning execution condition has been met. The second condition is provided to determine whether the off voltage deviation ΔVoff is stable.

If it is determined that the learning execution condition has been met in step S30, the process proceeds to step S31 in which the command discharge current Ioff* obtained during the current control interval is set as the off current initial value Ioffdf to execute the learning in association with the switch temperature Tsw, the power-supply voltage VHr, and the collector current obtained during the current control interval. Then, the map information is updated with the learned off current initial value Ioffdf. Thereafter, if the switching condition illustrated in FIG. 8 is met, the map information updated with the off current initial value Ioffdf is used.

Instead of using the learned off current initial value Ioffdf without change, a value obtained by decreasing the learned off current initial value Ioffdf, such as a value 90% of the learned off current initial value Ioffdf, may be used. The learning process may be performed, for example, in a plant before shipment of a product.

Figure 10:
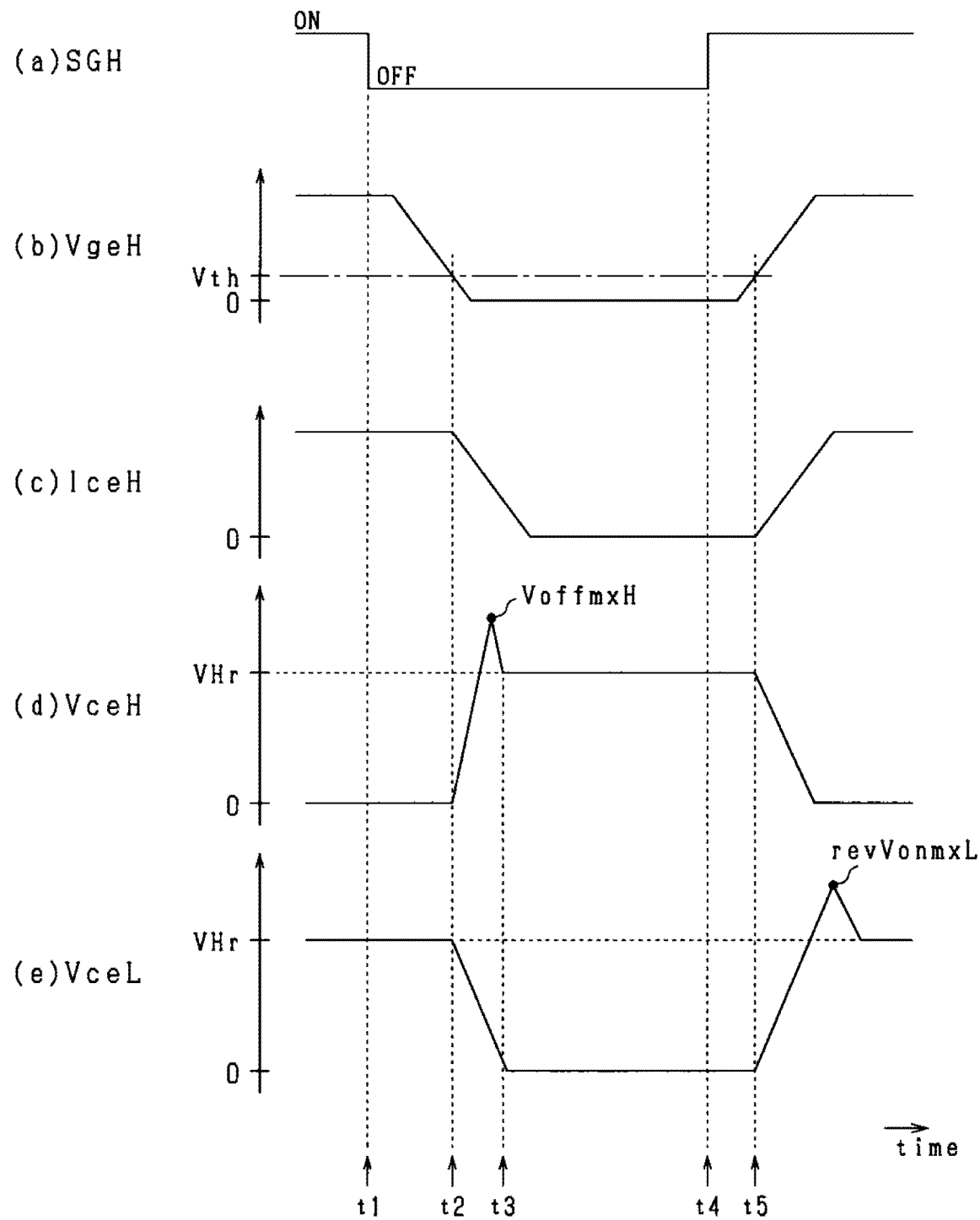

FIG. 10 illustrates changes in waveforms. Hereinafter, the upper arm drive circuit DrH will be described as an example. FIG. 10(a) illustrates a change in the upper arm drive signal SGH input to the upper arm drive circuit DrH. FIG. 10(b) illustrates a change in the upper arm gate voltage VgeH. FIG. 10(c) illustrates a change in a collector current IceH flowing to the upper arm switch SWH. FIG. 10(d) illustrates a change in the voltage VceH between the collector and the emitter of the upper arm switch SWH. FIG. 10(e) illustrates a change in the voltage VceL between the collector and the emitter of the lower arm switch SWL. In FIG. 10(b), a mirror period is not shown.

At time t1, the upper arm drive signal SGH is switched to an off command. Hence, thereafter, the upper arm gate voltage VgeH starts decreasing. Thereafter, at time t2, the upper arm gate voltage VgeH becomes the threshold voltage Vth. Hence, the collector current IceH starts decreasing, the voltage VceH between the collector and the emitter of the upper arm switch SWH starts increasing, and the voltage VceL between the collector and the emitter of the lower arm switch SWL starts decreasing. Thereafter, due to a surge voltage generated due to the change of the upper arm switch SWH to an off state, the voltage VceH between the collector and the emitter becomes the upper arm peak value VoffmxH. Thereafter, at time t3, the voltage VceH between the collector and the emitter becomes stable to become the power-supply voltage VHr.

Thereafter, at time t4, the upper arm drive signal SGH is switched to an on command. Hence, thereafter, the upper arm gate voltage VgeH starts increasing. At time t5, the upper arm gate voltage VgeH becomes the threshold voltage Vth. Hence, the collector current IceH starts increasing, the voltage VceH between the collector and the emitter of the upper arm switch SWH starts decreasing, and the voltage VceL between the collector and the emitter of the lower arm switch SWL starts increasing. Thereafter, due to a surge voltage generated due to the change of the upper arm switch SWH to an on state, the voltage VceL between the collector and the emitter of the lower arm switch SWL becomes a lower arm opposite peak value revVonmxL. The lower arm opposite peak value revVonmxL will be described later.

If it is determined that the change of the upper arm switch SWH to an off state is completed, the upper arm current control section 75 updates the command discharge current Ioff* for the upper arm switch SWH. Hence, the updated command discharge current Ioff* is used when the upper arm switch SWH is changed to an off state next time. The determination of the completion of the change to an off state is performed, for example, as below.

If it is determined that the upper arm gate voltage VgeH has become 0, it is determined that the change to an off state has completed.

If it is determined that the voltage VceH between the collector and the emitter has become a determination voltage or more, it is determined that the change to an off state has completed. The determination voltage may be set to a value higher than 0 and lower than the power-supply voltage VHr.

If it is determined that a predetermined time period has passed from time t1, at which switching to an off command is performed, during a time period (t1 to t4) during which the upper arm drive signal SGH is set to an off command, it is determined that the change to an off state has completed. The timing to which a predetermined time period has passed from time t1 may be set to, for example, a time period during which the gate voltage is set to 0.

The command discharge current Ioff* may be updated at every one switching period of the switch or every multiple switching periods (e.g., every two switching periods).

According to the present embodiment described above in detail, the following effects can be obtained.

The control unit 60 calculates the off voltage command value Voffref as speed adjustment information for adjusting a switching speed of the switch. Since the control unit 60 has a function of controlling a controlled variable of the rotary electric machine 40 and controlling the power-supply voltage VHr of the DCDC converter 20, the control unit 60 can determine control states of the inverter 30 and the DCDC converter 20 from this time. Hence, according to the present embodiment, an appropriate off voltage command value Voffref can be calculated based on the control states of the inverter 30 and the DCDC converter 20. In addition, since switching of the switch is performed based on the command discharge current Ioff* calculated from the off voltage command value Voffref, an effect of suppressing a surge voltage and an effect of reducing switching loss can be prevented from decreasing when the switch is changed to an off state.

As an operation amount for feedback control of the off surge value Voffr calculated by the off time surge calculation section 100 to the off surge command value Voff*, the off time discharge current Ioffc is calculated. According to this configuration, even when characteristics of switches, such as individual differences, temperature characteristics, and deterioration states, vary somewhat, an appropriate off time discharge current Ioffc that reduces switching loss while suppressing a surge voltage can be calculated.

When the off voltage deviation ΔVoff is large, at least one of the proportional gain Kp and the integral gain Ki is set larger than that in a case in which the off voltage deviation ΔVoff is small. Hence, the time period required for the off surge value Voffr to reach the off surge command value Voff* can be reduced while keeping the safety of the switch, whereby the time period required to optimize switching loss can be reduced.

The off current initial value Ioffdf is calculated based on the power-supply voltage VHr, the switch temperature Tsw, the collector current, and the map information. If it is determined that the switching condition is met, the off current initial value Ioffdf is set to the command discharge current Ioff*. Hence, for example, when control states of the inverter 30 and the DCDC converter 20 are suddenly changed, the control can be changed to a safe state to protect the switch adequately. In addition, since the off current initial value Ioffdf is calculated based on the power-supply voltage VHr, the switch temperature Tsw, and the collector current, the adjustment amount of discharge current required until switching loss is optimized can be decreased, which can improve efficiency in the inverter 30 and the DCDC converter 20.

A learning process for learning the feedback off current Iofffb is performed in association with the power-supply voltage VHr, the switch temperature Tsw, and the collector. Hence, even when characteristics of the switches are uneven, an appropriate off current initial value Ioffdf that can provides an effect of suppressing a surge voltage and an effect of reducing switching loss can be determined.

The off time voltage limitation section 101 limits the off voltage command value Voffref to the limit value Vofflim. Hence, even when a reception error of the off voltage command value Voffref, an abnormity of the control unit 60, or a sudden change in control states of the inverter 30 and the DCDC converter 20 occur, a voltage between the collector and the emitter of the switch can be appropriately avoided from exceeding the withstand voltage Vlim.

The off time current limitation section 104 limits the off time discharge current Ioffc to the discharge limitation current Iofflim. Hence, the switching speed of the switch can be prevented from exceeding the allowable upper limit value, whereby the occurrence of a failure of the switch can be prevented. In addition, a surge voltage can be suppressed, whereby the voltage applied to the winding 41 of the rotary electric machine 40 can be prevented from exceeding the withstand voltage thereof, and a voltage between the collector and the emitter of the switch can be prevented from exceeding the withstand voltage Vlim.

Modifications of First Embodiment

The drive circuit may not receive the power-supply voltage VHr from the control unit 60 but detect the power-supply voltage VHr by itself. For example, when if the switch is in an off state, a voltage between the collector and the emitter of the switch detected by the surge detection section of the drive circuit may be used as the power-supply voltage VHr.

In step S10 in FIG. 4, the lower temperature between the upper arm switch temperature TswH and the lower arm switch temperature TswL may be used for setting the upper and lower arm withstand voltages VlimH, VlimL.

In step S10 in FIG. 4, the upper and lower arm withstand voltages VlimH, VlimL may be set to a constant value that does not depend on temperatures.

In step S11 in FIG. 4, during the time period during which a current following to the switch increases, the off voltage command value Voffref may be decreased depending on the current value. In this case, in the DCDC converter 20, instead of a detection value of the reactor current sensor 53, an estimated value of a current flowing to the reactor 22 may be used. For example, an estimated value of the current may be calculated based on the power-supply voltage VHr and output power W of the DCDC converter 20 calculated based on a torque command value and a rotational speed of the rotary electric machine 40.

Figure 21:
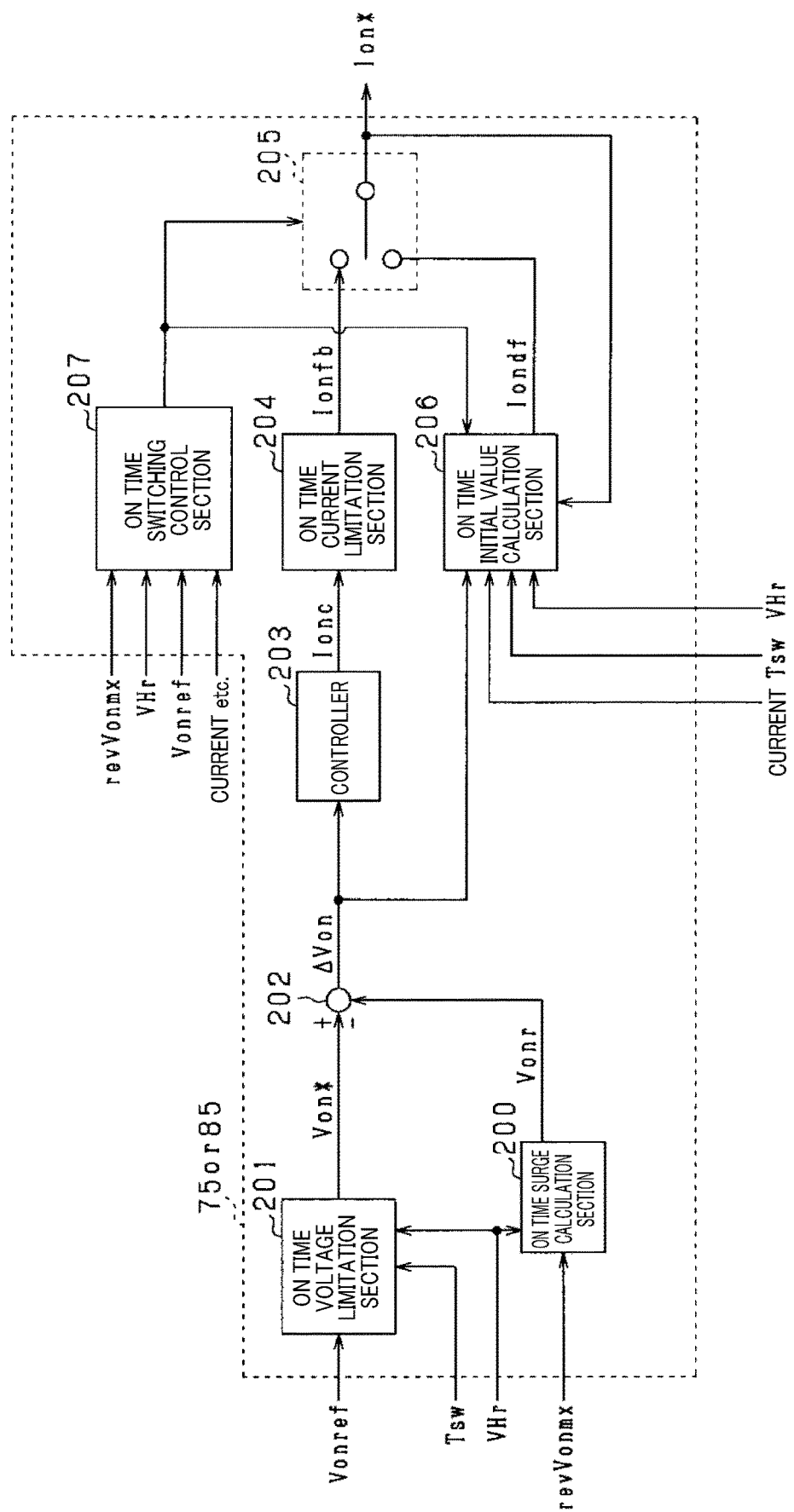
FIG. 21 is a block diagram of a process performed by the current control section.

In the initial value calculation process and the learning process of the off time initial value calculation section 106 in FIG. 6 and an on time initial value calculation section 206 in FIG. 21, a collector current may not be used. In this case, when a collector current is a value larger than the center of the range within which the collector current can fall (e.g., the upper limit in the range), the map information may be information in which the off current initial value Ioffdf is defined in association the switch temperature Tsw and the power-supply voltage VHr.

The calculation of the off current initial value Ioffdf may use, instead of the map information, mathematical expression information in which the off current initial value Ioffdf is defined which is associated with the power-supply voltage VHr, the switch temperature Tsw, and the collector current.

If it is determined that the upper arm gate voltage VgeH has become a specified voltage or less, it may be determined that the change to an off state has been completed. The specified voltage may be set to a value higher than 0 and equal to or less than the threshold voltage Vth. When the specified voltage is set to the same value as the threshold voltage Vth, in FIG. 10, the timing at which it is determined that the change has been completed is time t2.

In step S10 in FIG. 4, a temperature of a switch other than the switch that configures an electrical power converter and is a setting target of a withstand voltage may be used to set the withstand voltage. For example, the lower arm switch temperature TswL of the inverter 30 may be used to set the upper arm withstand voltage VlimH of the inverter 30.

The off time voltage limitation section 101 may calculate the limit value Vofflim based on the power-supply voltage VHr or the switch temperature Tsw only.

The off time initial value calculation section 106 may calculate the off current initial value Ioffdf based on the power-supply voltage VHr or the switch temperature Tsw only.

The off time initial value calculation section 106 may not perform the learning process. In this case, the off time initial value calculation section 106 may not include a function of monitoring the off voltage deviation ΔVoff and the command discharge current Ioff*.

The off time initial value calculation section 106, the command discharge current setting section 105, and the off time switching control section 107 may not be included in the current control sections 75, 85. In this case, the feedback off current Iofffb is the command discharge current Ioff*.

The method of adjusting switching speed is not limited to a method of adjusting a gate resistance value. For example, the switching speed may be adjusted by adjusting a voltage of a power supply supplying a voltage to the gate. For example, when constant current control that charges the gate with a constant current or discharges the gate at a constant current is performed, the value of the constant current may be adjusted to adjust the switching speed.

Second Embodiment

Hereinafter, the second embodiment will be described focusing on the differences from the first embodiment with reference to the drawings. In the present embodiment, information on a current flowing to a switch is used to set the off voltage command value Voffref and the like.

Figure 11:
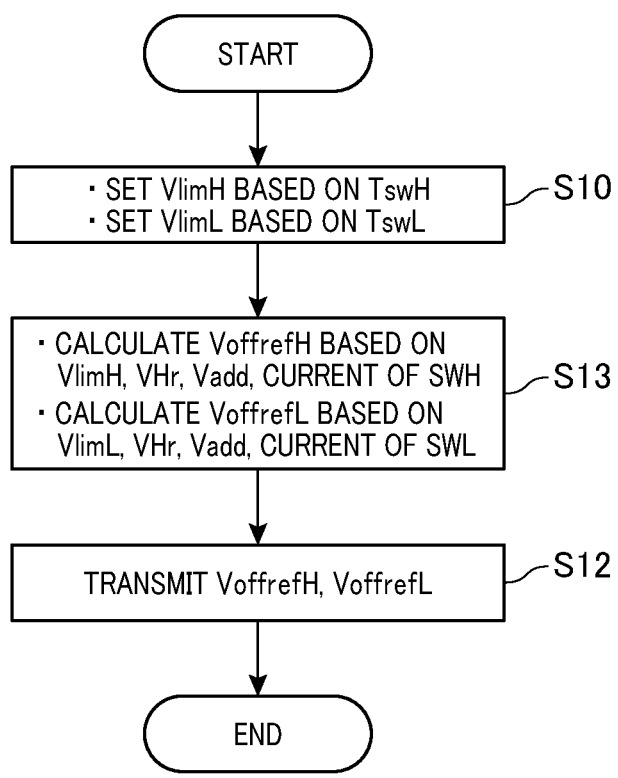
FIG. 11 is a flowchart illustrating a procedure of a process performed by a control unit according to a second embodiment.

FIG. 11 illustrates a procedure of a process performed by the control unit 60. This process is repeatedly performed, for example, at predetermined control intervals. In FIG. 11, the same step as that shown in FIG. 4 is denoted by the same reference sign for the sake of convenience.

In step S13, the control unit 60 calculates the upper arm off voltage command value VoffrefH based on the upper arm withstand voltage value VlimH, the power-supply voltage VHr, the superimposed surge Vadd, and information on a collector current flowing to the upper arm switch SWH. Specifically, the control unit 60 subtracts an additional value of the power-supply voltage VHr and the superimposed surge Vadd from the upper arm withstand voltage value VlimH to calculate a basic value of the upper arm off voltage command value VoffrefH. If the collector current has not increased, the calculated basic value is set to the final upper arm off voltage command value VoffrefH without change. In contrast, if the collector current has increased, a value obtained by decreasing the calculated basic value is set to the final upper arm off voltage command value VoffrefH. Hence, when the collector current increases, the switching speed of upper arm switch SWH can be lowered to reduce the surge voltage. It is noted that if it is determined that a specified time period has passed from the time when the collector current starts increasing, or it is determined that the absolute value of the off voltage deviation ΔVoff is a specified value in the vicinity of 0 or less, the calculated basic value may be set to the final upper arm off voltage command value VoffrefH.

As the information on a collector current flowing to the upper arm switch SWH, for example, a detection value of the phase current sensor 50, the upper arm sense voltage VsH received from the upper arm drive circuit DrH, or a current command value may be used.

In addition, in step S13, the control unit 60 calculates the lower arm off voltage command value VoffrefL based on the lower arm withstand voltage value VlimL, the power-supply voltage VHr, the superimposed surge Vadd, and information on a collector current flowing to the lower arm switch SWL. This calculation method is similar to the method of calculating the upper arm off voltage command value VoffrefH. Specifically, the control unit 60 subtracts an additional value of the power-supply voltage VHr and the superimposed surge Vadd from the lower arm withstand voltage value VlimL to calculate a basic value of the lower arm off voltage command value VoffrefL. If the collector current has not increased, the calculated basic value is set to the final lower arm off voltage command value VoffrefL without change. In contrast, if the collector current has increased, a value obtained by decreasing the calculated basic value is set to the final lower arm off voltage command value VoffrefL.

As the information on a collector current flowing to the lower arm switch SWL, for example, a detection value of the phase current sensor 50, the lower arm sense voltage VsL received from the lower arm drive circuit DrL, or a current command value may be used.

The calculated final upper and lower arm off voltage command values VoffrefH, VoffrefL are transmitted to the upper and lower arm drive circuits DrH, DrL in step S12.

Figure 12:
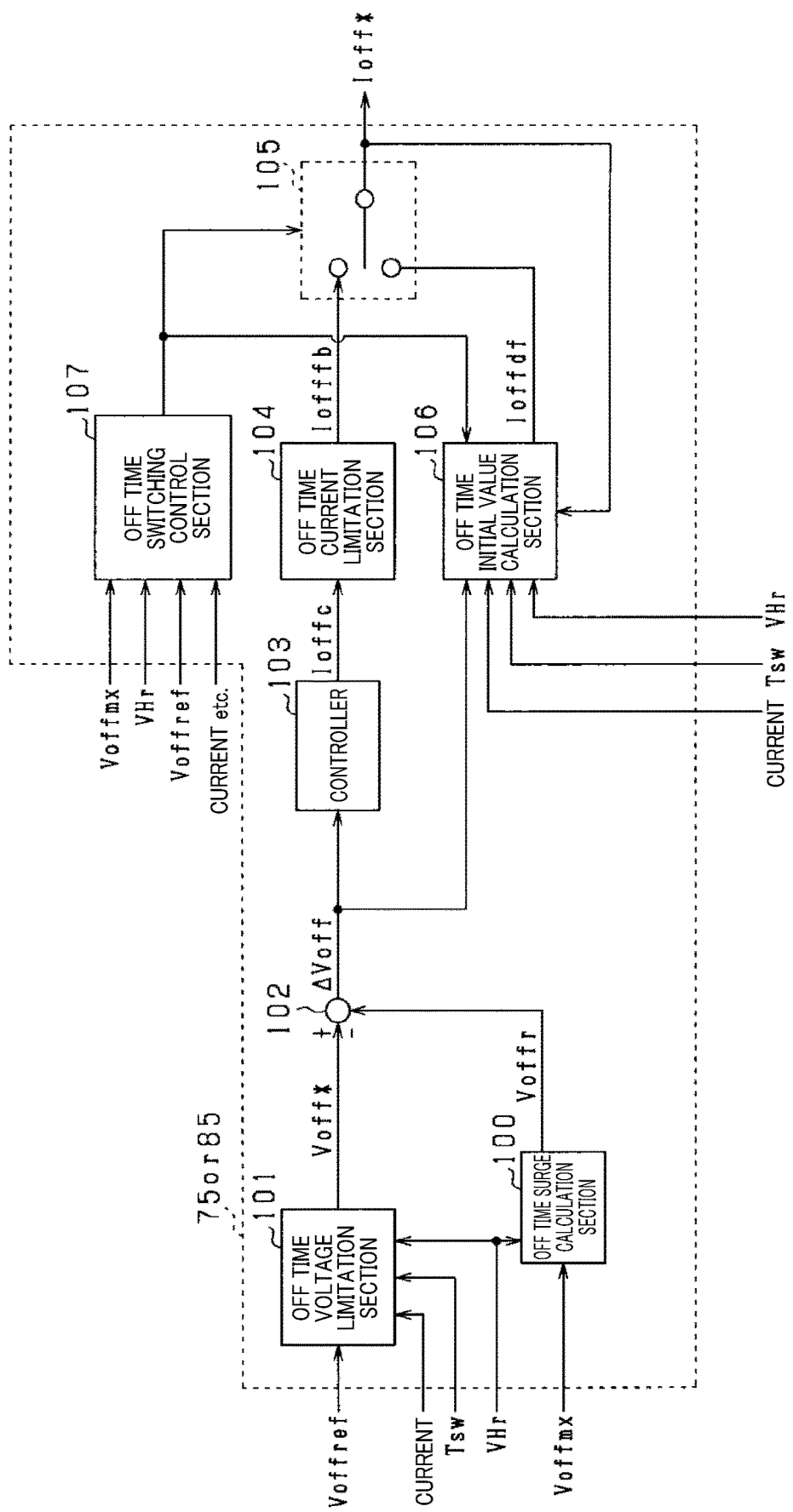
FIG. 12 is a block diagram of a process performed by the current control section.

FIG. 12 is a block diagram of a process performed by the upper and lower arm current control sections 75, 85 of the upper and lower arm drive circuits DrH, DrL. In FIG. 12, the same component as that shown in FIG. 6 or the component corresponding to that shown in FIG. 6 is denoted by the same reference sign for the sake of convenience. In the description of FIG. 12, the collector current following to the upper and lower arm switches SWH, SWL will be simply referred to as a collector current, and the upper and lower sense voltages VsH, VsL will be simply referred to as a sense voltage Vs.

The off time voltage limitation section 101 calculates a limit value Vofflim of the off voltage command value Voffref based on the switch temperature TswH, the power-supply voltage VHr, and the collector current. The off time voltage limitation section 101 calculates the limit value Vofflim by the same method as in steps S10, S13 in FIG. 11. That is, the switch temperature Tsw, the power-supply voltage VHr, the superimposed surge Vadd, and presence or absence of an increase in the collector current provide the same limit value Vofflim and off voltage command value Voffref. As the collector current, for example, a detection value of the phase current sensor 50, a sense voltage Vs, or a current command value may be used.

Modifications of Second Embodiment

The off time voltage limitation section 101 may calculate the limit value Vofflim based on the collector current and either the power-supply voltage VHr or the switch temperature Tsw.

The off time initial value calculation section 106 may calculate the off current initial value Ioffdf based on the collector current and either the power-supply voltage VHr or the switch temperature Tsw. The off time initial value calculation section 106 may calculate the off current initial value Ioffdf based on the collector current only.

Third Embodiment

Hereinafter, the third embodiment will be described focusing on the differences from the first embodiment with reference to the drawings. In the present embodiment, the method of setting the off voltage command value Voffref is modified.

Figure 13:
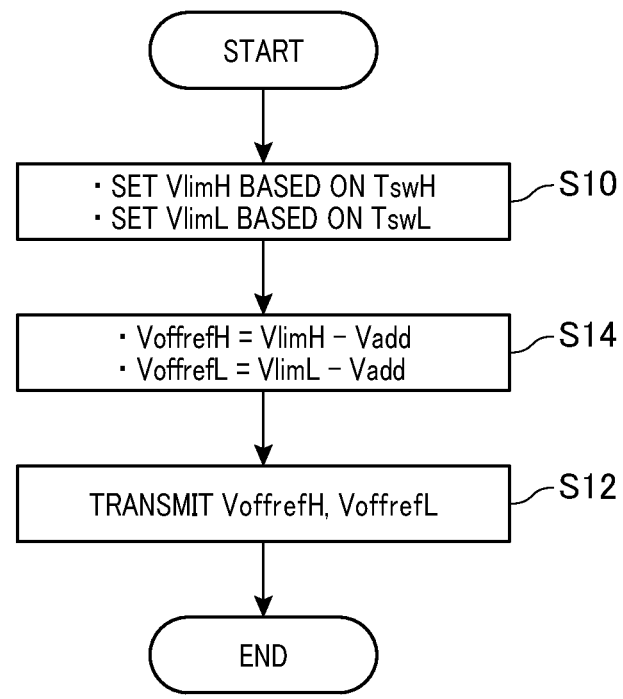
FIG. 13 is a flowchart illustrating a procedure of a process performed by a control unit according to a third embodiment.

FIG. 13 illustrates a procedure of a process performed by the control unit 60. This process is repeatedly performed, for example, at predetermined control intervals. In FIG. 13, the same step as that shown in FIG. 4 is denoted by the same reference sign for the sake of convenience.

Figure 14:
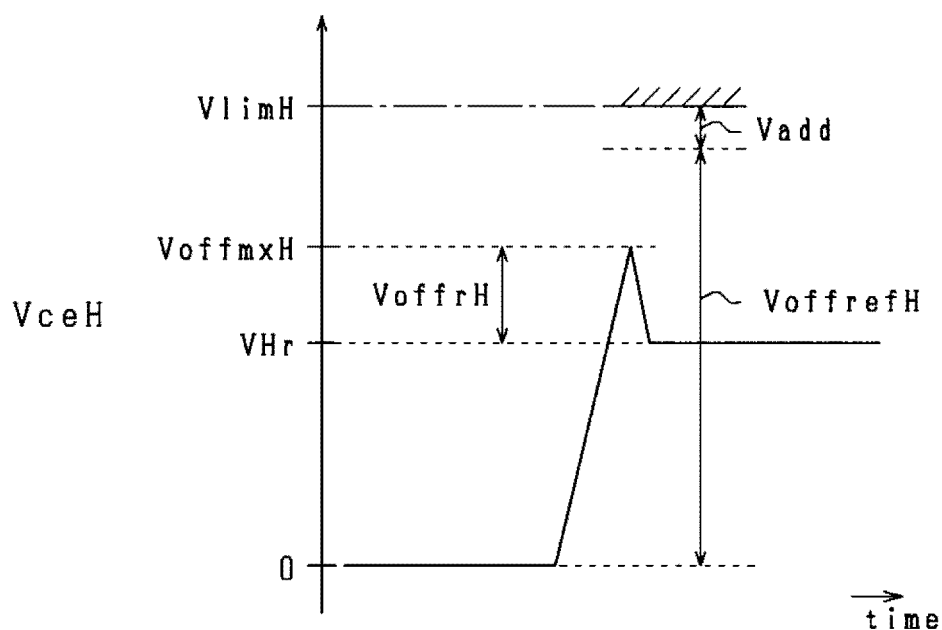
FIG. 14 is a timing diagram illustrating a method of calculating a surge reference value.

In step S14, as shown in FIG. 14, the control unit 60 subtracts the superimposed surge Vadd from the upper arm withstand voltage value VlimH to calculate the upper arm off voltage command value VoffrefH. In addition, the control unit 60 subtracts the superimposed surge Vadd from the lower arm withstand voltage value VlimL to calculate the lower arm off voltage command value VoffrefL.

Figure 15:
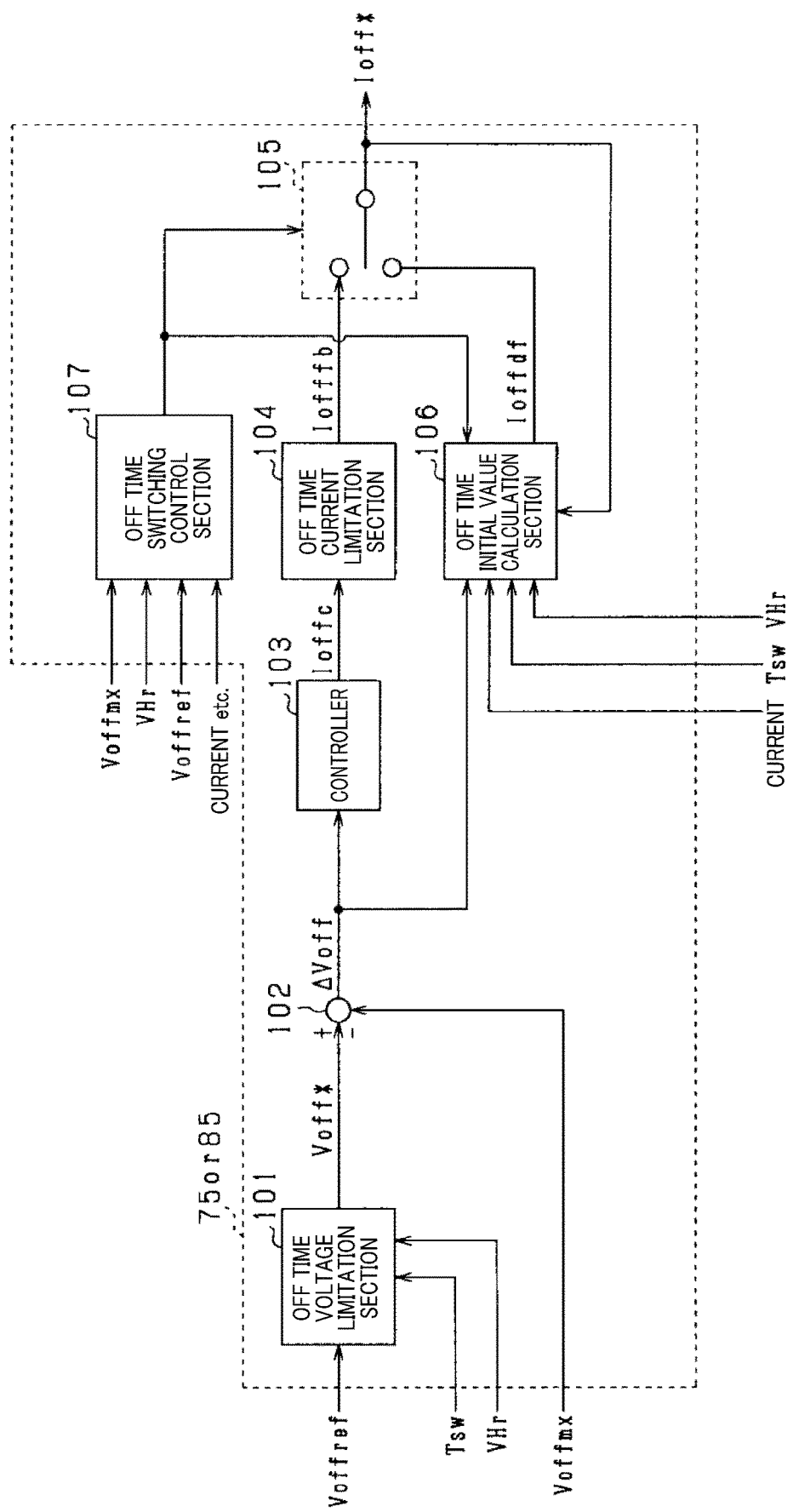
FIG. 15 is a block diagram of a process performed by the current control section.

FIG. 15 is a block diagram of a process performed by the upper and lower arm current control sections 75, 85 of the upper and lower arm drive circuits DrH, DrL. In FIG. 15, the same component as that shown in FIG. 6 or the component corresponding to that shown in FIG. 6 is denoted by the same reference sign for the sake of convenience.

The current control section does not include the off time surge calculation section 100. Hence, the off voltage deviation calculation section 102 subtracts the peak value Voffmx from the off surge command value Voff* set by the off time voltage limitation section 101 to calculate the off voltage deviation ΔVoff.

According to the present embodiment described above, the effects similar to those of the first embodiment can be obtained.

Modifications of Third Embodiment

As in the second embodiment, a current flowing to the switch in the off time voltage limitation section 101 may be used. In the process of the off time initial value calculation section 106, as in the modification of the first embodiment, the current flowing to the switch may not be used.

Fourth Embodiment

Hereinafter, the fourth embodiment will be described focusing on the differences from the first embodiment with reference to the drawings. In the present embodiment, the speed adjustment information is modified.

Figure 16:
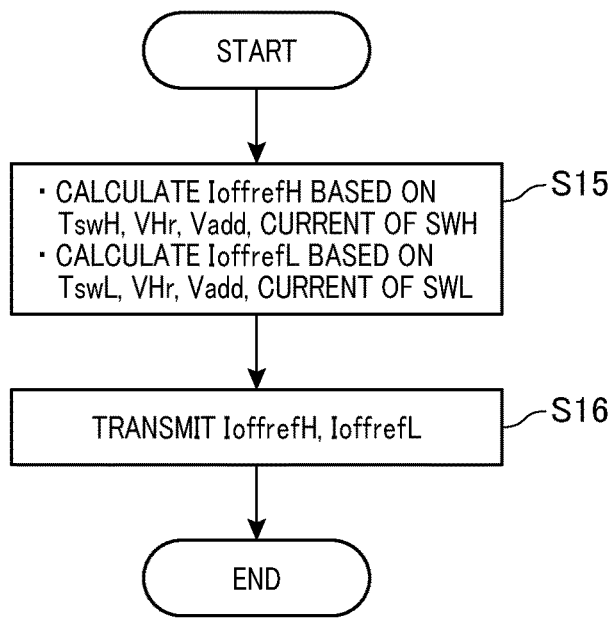
FIG. 16 is a flowchart illustrating a procedure of a process performed by a control unit according to a fourth embodiment.

FIG. 16 illustrates a procedure of a process performed by the control unit 60. This process is repeatedly performed, for example, at predetermined control intervals.

In step S15, the control unit 60 calculates an upper arm off current command value IoffrefH based on the upper arm switch temperature TswH, the power-supply voltage VHr, the superimposed surge Vadd, and a collector current flowing to the upper arm switch SWH. As the upper arm switch temperature TswH is higher, as the power-supply voltage VHr is lower, or as the collector current flowing to the upper arm switch SWH is lower, the upper arm off current command value IoffrefH may be calculated to be larger.

In step S15, the control unit 60 calculates a lower arm off current command value IoffrefL based on the lower arm switch temperature TswL, the power-supply voltage VHr, the superimposed surge Vadd, and a collector current flowing to the lower arm switch SWL. As the lower arm switch temperature TswL is higher, as the power-supply voltage VHr is lower, or as the collector current flowing to the lower arm switch SWL is lower, the lower arm off current command value IoffrefL may be calculated to be larger. In the present embodiment, the upper and lower arm off current command values IoffrefH, IoffrefL correspond to the speed adjustment information.

In step S16, the control unit 60 transmits the calculated upper arm off current command value IoffrefH to the upper arm drive circuit DrH, and transmits the calculated lower arm off current command value IoffrefL to the lower arm drive circuit DrL.

Figure 17:
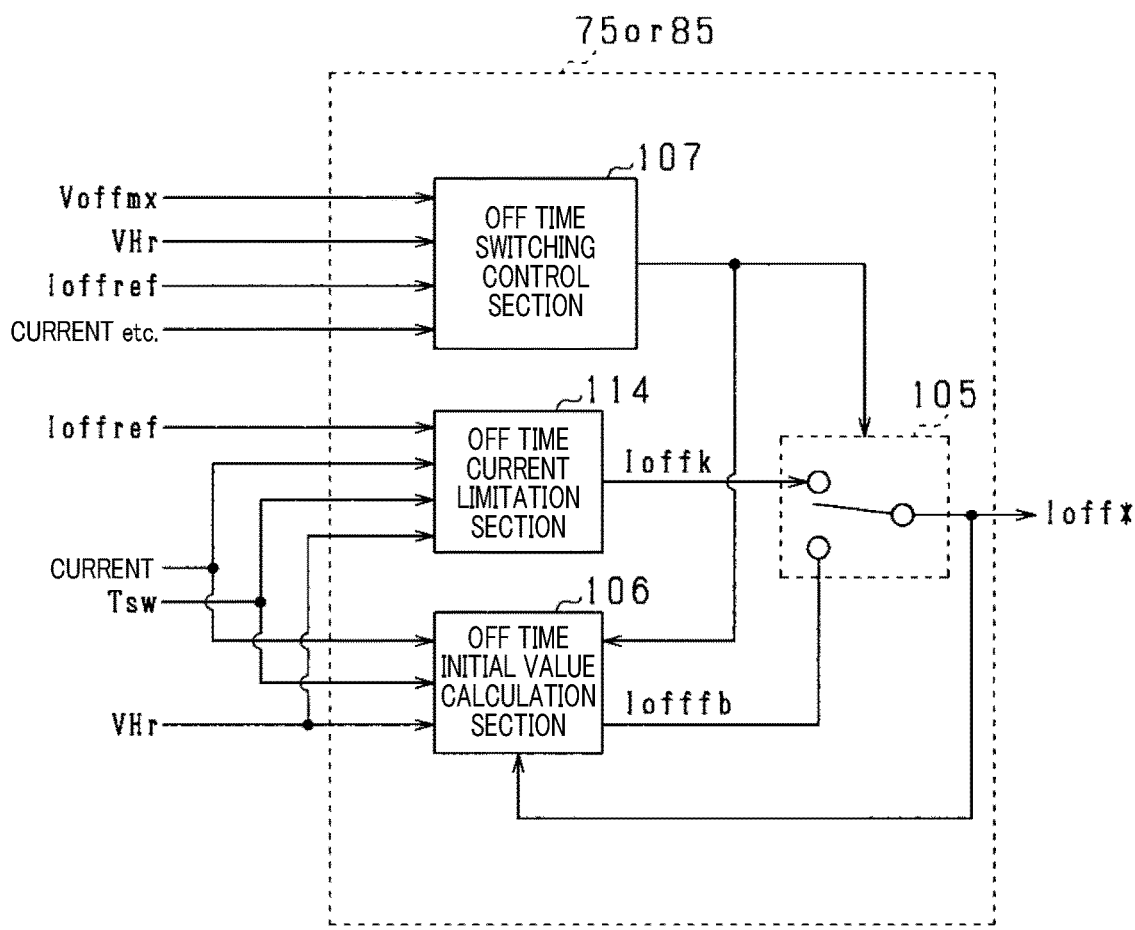
FIG. 17 is a block diagram of a process performed by the current control section.

FIG. 17 is a block diagram of a process performed by the upper and lower arm current control sections 75, 85 of the upper and lower arm drive circuits DrH, DrL. In the present embodiment, basically the same process is performed by the upper and lower arm current control sections 75, 85. Hence, hereinafter, the upper and lower arm off current command values IoffrefH, IoffrefL are simply referred to as an off current command value Ioffref.

An off time current limitation section 114 has functions similar to those of the off time voltage limitation section 101 and the off time current limitation section 104. The off time current limitation section 114 calculates a discharge limit value Iofflim, which is a limit value of the off current command value Ioffref, based on the switch temperature TswH, the power-supply voltage VHr, and the collector current. If the received off current command value Ioffref is the discharge limit current Iofflim or less, the off time current limitation section 114 sets the received off current command value Ioffref as a feedback off current Ioffk. In contrast, if the received off current command value Ioffref is more than the discharge limit current Iofflim, the off time current limitation section 114 sets the discharge limit current Iofflim as the feedback off current Ioffk.

The off time current limitation section 114 calculates the limit current Iofflim by the same method as in step S15 in FIG. 16. That is, the switch temperature Tsw, the power-supply voltage VHr, the collector current, and the superimposed surge Vadd provide the same discharge limit current Iofflim and off current command value Ioffref.

The discharge limit current Iofflim may be determined under the constraint that the switch does not fail and the constraint that the drive circuit does not fail.

The command discharge current setting section 105 sets the feedback off current Ioffk calculated by the off time current limitation section 114 or the off current initial value Ioffdf calculated by the off time initial value calculation section 106, to the command discharge current Ioff*.

According to the present embodiment described above, the effects according to the first embodiment can be obtained.

Modifications of Fourth Embodiment

In the off time current limitation section 114 and the off time initial value calculation section 106, the current flowing to the switch may not be used.

The off time initial value calculation section 106, the command discharge current setting section 105, and the off time switching control section 107 may not be included in the current control sections 75, 85. In this case, the feedback off current Ioffk is set to the command discharge current Ioff*.

Fifth Embodiment

Figure 18:
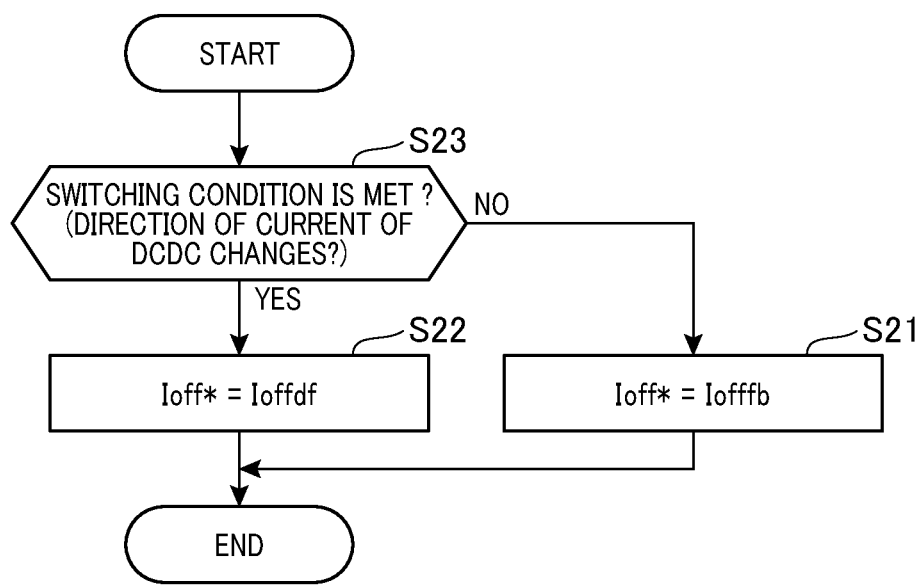
FIG. 18 is a flowchart illustrating a procedure of a process performed by a switching control section according to a fifth embodiment.

Hereinafter, the fifth embodiment will be described focusing on the differences from the first embodiment with reference to the drawings. The present embodiment is characterized by a switching condition of the off time switching control section 107 of the drive circuit of the DCDC converter 20. FIG. 18 illustrates a procedure of a process performed by the off time switching control section 107. In the present embodiment, the process illustrated in FIG. 18 corresponds to a processing section.

In step S23, the off time switching control section 107 determines whether a switching condition is met. The switching condition of the present embodiment is that the direction of the current flowing to the DCDC converter 20, more specifically, the direction of the current flowing to the reactor 22, changes. As described in JP 2016-178712 A, the direction of the current flowing to the reactor 22 changes along with the change between powering control and regenerative control of the rotary electric machine 40. In this case, due to the dead time of the upper and lower arm transformation switches SCH, SCL, a voltage increase ration, which is a ratio of the power-supply voltage VHr to the input voltage VLr, changes discontinuously. As a result, a surge voltage is generated. The process illustrated in FIG. 18 is used to perform the control safely under such a situation. Whether the direction of the current changes may be determined based on, for example, a detection value of the reactor current sensor 53 or the estimated value of the current described above. Specifically, for example, if it is determined that the absolute value of the detection value of the reactor current sensor 53 or the absolute value of the estimated value of the current is a predetermined current value or less, it may be determined the direction of the current changes.

The control unit 60 performs the same process as that in step S23. If an affirmative determination is made in this process, the off voltage command value Voffref may be lowered. Even in this case, the switching speed can be lowered.

According to the present embodiment described above, the switching speed can be adjusted with expecting fluctuation in output voltage of the DCDC converter 20. Hence, the DCDC converter 20 can be controlled more safely.

Modifications of Fifth Embodiment

As a process for lowering a switching speed, instead of the process illustrated in FIG. 18 performed by the off time switching control section 107 of the drive circuit, the control unit 6 may perform the process described later. For example, in the first embodiment, if it is determined that the condition that the direction of the current flowing to the DCDC converter changes is met, the control unit 60 may perform a process for lowering the off voltage command value Voffref. For example, in the fourth embodiment, if it is determined that the condition that the direction of the current flowing to the DCDC converter changes is met, the control unit 60 may perform a process for lowering the off current command value Ioffref.

Sixth Embodiment

Hereinafter, the sixth embodiment will be described focusing on the differences from the first embodiment with reference to the drawings. In the present embodiment, a resistance value of the upper arm resistor 71 in a case where the upper arm switch SWH is changed to an on state and a resistance value of the lower arm resistor 81 in a case where the lower arm switch SWL is changed to an on state are adjusted. The inverter 30, which is similar to DCDC converter 20, will be described as an example.

The upper arm surge detection section 72 detects a surge voltage generated due to the change to an on state of the lower arm switch SWL. Specifically, the upper arm surge detection section 72 detects a peak value of a surge voltage generated due to the change to an on state of the lower arm switch SWL as an upper arm opposite peak value revVonmxH. That is, when the lower arm switch SWL is changed to an on state, a current starts to flow through a path including the lower arm switch SWL through which no current has flowed. Then, a surge is generated by L×di/dt, where di/dt is a rate of increase of the current, and L is inductance.

FIG. 19 illustrates an example of a state in which a surge voltage is generated due to the change of the lower arm switch SWL to an on state. At the dead time at which both of the upper arm switch SWH and the lower arm switch SWL are in off states as shown in FIG. 19(*a*), when the lower arm switch SWL changes to an on state as shown in FIG. 19(*b*), a reverse voltage is applied to an upper arm diode DH, whereby a recovery current flows to the upper arm diode DH. Since the rate of change of the recovery current is high, the surge voltage becomes large.

The lower arm surge detection section 82 detects a surge voltage generated due to the change to an on state of the upper arm switch SWH. Specifically, the lower arm surge detection section 82 detects a peak value of a surge voltage generated due to the change to an on state of the upper arm switch SWH as a lower arm opposite peak value revVonmxL. That is, when the upper arm switch SWH is changed to an on state, a current starts to flow through a path including the upper arm switch SWH through which no current has flowed. Then, a surge is generated by L×di/dt described above.

FIG. 20 illustrates an example of a state in which a surge voltage is generated due to the change of the upper arm switch SWH to an on state. In a state of the dead time shown in FIG. 20(*a*), when the upper arm switch SWH changes to an on state as shown in FIG. 20(*b*), a surge voltage is generated. When the upper arm switch SWH changes to an on state, a reverse voltage is applied to a lower arm diode DL, whereby a recovery current flows to the lower arm diode DL. Since the rate of change of the recovery current is high, the surge voltage becomes large.

In the present embodiment, the upper arm drive circuit DrH and the lower arm drive circuit DrL communicate information on the detected opposite peak value to each other. The method of communicating the information includes a method using an isolation amplifier, a method with the control unit 60, and methods illustrated in FIG. 22 and FIG. 23 described later.

The control unit 60 calculates an upper arm on voltage command value VonrefH and a lower arm on voltage command value VonrefL (corresponding to speed adjustment information and a surge reference value). Specifically, the control unit 60 subtracts an additional value of the power-supply voltage VHr and the superimposed surge Vadd from the upper arm withstand voltage value VlimH to calculate the upper arm on voltage command value VonrefH. The control unit 60 subtracts an additional value of the power-supply voltage VHr and the superimposed surge Vadd from the lower arm withstand voltage value VlimL to calculate the lower arm on voltage command value VonrefL.

FIG. 21 is a block diagram of a process performed by the upper and lower arm current control sections 75, 85 of the upper and lower arm drive circuits DrH, DrL. In the present embodiment, basically the same process is performed by the upper and lower arm current control sections 75, 85. Hence, hereinafter, the upper and lower arm opposite peak values revVonmxH, revVonmxL are simply referred to as an opposite peak value revVonmx, and the upper and lower arm on voltage command values VonrefH, Vonref are simply referred to as an on voltage command value Vonref.

An on time surge calculation section 200 subtracts the power-supply voltage VHr, which is received from the control unit 60, from the opposite peak value revVonmx to calculate an on surge value Vonr. Specifically, the on time surge calculation section 200 of the upper arm current control section 75 subtracts the power-supply voltage VHr from the lower arm opposite peak value revVonmxL to calculate the surge value Vonr. The on time surge calculation section 200 of the lower arm current control section 85 subtracts the power-supply voltage VHr from the upper arm opposite peak value revVonmxH to calculate an on surge value Vonr.

An on time voltage limitation section 201 corresponds to an adjustment information limitation section and calculates a limit value Vonlim of the on voltage command value Vonref based on the switch temperature TswH and the power-supply voltage VHr. If the received on voltage command value Vonref is the limit value Vonlim or less, the on time voltage limitation section 201 sets the received on voltage command value Vonref as an on surge command value Von*. In contrast, if the received on voltage command value Vonref is more than the limit value Vonlim, the on time voltage limitation section 201 sets the limit value Vonlim as an on surge command value Von*.

The on time voltage limitation section 201 calculates the limit value Vonlim by the same method as the method of calculating the on voltage command value Vonref performed by the control unit 60. That is, the switch temperature Tsw, the power-supply voltage VHr, and the superimposed surge Vadd provide the same limit value Vonlim and on voltage command value Vonref.

An on voltage deviation calculation section 202 subtracts the on surge value Vonr calculated by the on time surge calculation section 200 from the on surge command value Von* set by the on time voltage limitation section 201 to calculate an on voltage deviation ΔVon.

An on time controller 203 calculates an on time charge current Ionc to be supplied to the gate of a switch, as an operation amount for feedback control of the calculated on voltage deviation ΔVon to 0. In the present embodiment, the on time controller 203 calculates the on time charge current Ionc by proportional-integral control based on the on voltage deviation ΔVon. In the present embodiment, the on time charge current Ionc corresponds to command switching speed information. As the on time discharge current Ionc is larger, the switching speed when a switch is changed to an on state becomes high. In the present embodiment, the on time surge calculation section 200, the on voltage deviation calculation section 202, and the on time controller 103 correspond to a speed calculation section.

The on time controller 203 sets at least one of a proportional gain Kp and an integral gain Ki used for the proportional-integral control so as to be larger in a case in which the on voltage deviation ΔVon (specifically, the absolute value of the on voltage deviation ΔVon) is large than in a case in which the on voltage deviation ΔVon is small. The feedback control by the on time controller 203 may include differential control.

An on time current limitation section 204 corresponds to a command information limitation section. If the on time charge current Ionc calculated by the on time controller 203 is a charge limitation current Ionlinn or less, the on time current limitation section 204 sets the calculated on time charge current Ionc as a feedback on current Ionfb. In contrast, if the on time charge current Ionc is more than the charge limitation current Ionlinn, the on time current limitation section 204 sets the charge limitation current Ionlinn as the feedback on current Ionfb. The charge limitation current Ionlinn may be determined under the constraint that the switch does not fail and the constraint that the drive circuit does not fail.

A command discharge current setting section 205 sets the feedback on current Ionfb calculated by the on time current limitation section 104 or an on current initial value Iondf calculated by an on time initial value calculation section 106 described later, to a command charge current Ion* to be provided to the gate of the switch. For example, when the upper arm switch SWH is changed to an on state, the upper arm current control section 75 adjusts a resistance value of the upper arm resistor 71 so that an actual charge current of the upper arm switch SWH becomes the command charge current Ion*.

The on time initial value calculation section 206 calculates the on current initial value Iondf based on the switch temperature Tsw, the power-supply voltage VHr and the collector current, and map information in which the on current initial value Ionf is defined in association with the switch temperature Tsw, the power-supply voltage VHr, and the collector current (corresponding to definition information).

An on time switching control section 207 determines whether the feedback on current Ionfb is set as the command charge current Ion* or the on current initial value Iondf is set as the command charge current Ion*. This determination may be made by a process similar to the process illustrated in FIG. 8. In the present embodiment, the command charge current setting section 205 and the on time switching control section 207 correspond to a switching section.

The on time initial value calculation section 206 performs a learning process similar to the process illustrated in FIG. 9. If it is determined that the learning execution condition has been met, the on time initial value calculation section 206 learns, as the on current initial value Iondf, the command charge current Ion* set during the current control interval, in connection with the switching time period Tsw, the power-supply voltage VHr, and the collector current obtained during the current control interval. Then, the map information is updated.

If it is determined that the change of the upper arm switch SWH to an on state is completed, the upper arm current control section 75 updates the command charge current Ion* for the upper arm switch SWH. Hence, the updated command charge current Ion* is used when the upper arm switch SWH is changed to an off state next time. The determination of the completion of the change to an on state is performed, for example, as below.

If it is determined that the upper arm gate voltage VgeH has been saturated, that is, the upper arm gate voltage VgeH has become a power-supply voltage of the power supply of the gate, it is determined that the change to an on state has been completed.

If it is determined that the voltage VceH between the collector and the emitter has become the determination voltage or less, it is determined that the change to an on state has been completed.

If it is determined that the predetermined time period has passed from the timing, at which switching to an on command is performed, during a time period during which the upper arm drive signal SGH is set to an on command, it is determined that the change to an on state has been completed.

According to the present embodiment described above, the effects similar to those of the first embodiment can be obtained even when a switch is changed to an on state. The configuration of the present embodiment may be applied with the effects of the first embodiment. In this case, in each of the cases where a switch is changed to an off state and where a switch is changed to an on state, the switching speed can be optimized, whereby losses in the inverter 30 and the DCDC converter 20 can be reduced.

Modifications of Sixth Embodiment

If it is determined that the upper arm gate voltage VgeH is the specified voltage or more, it may be determined that the change to an off state has been completed.

As in the second embodiment, a current flowing to the switch may be used in the on time voltage limitation section 201 and the time initial value calculation section 206.

As in the third embodiment, the superimposed surge Vadd may be subtracted from the upper arm withstand voltage value VlimH to calculate the upper arm on voltage command value VonrefH, and the superimposed surge Vadd may be subtracted from the lower arm withstand voltage value VlimL to calculate the lower arm on voltage command value VonrefL.

The speed adjustment information calculated by the control unit 60 may be an on current command value, which is a gate current value, as in the fourth embodiment.

Other Modifications

Figure 22:
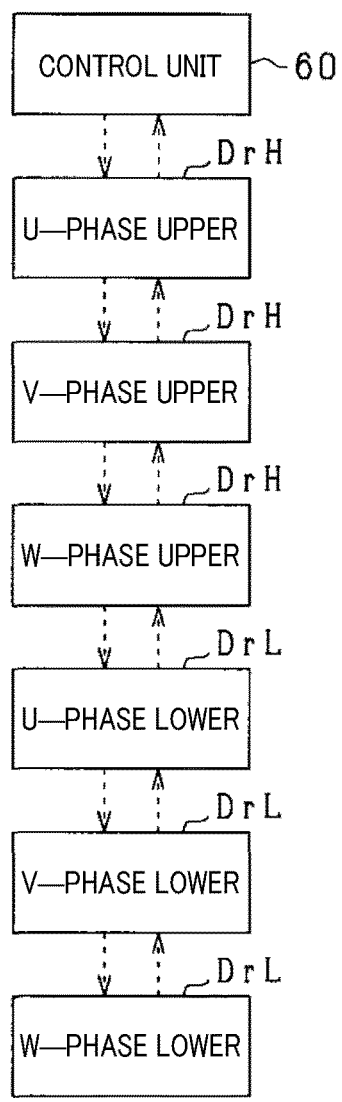
FIG. 22 is a drawing illustrating a communication state between a control unit and each drive circuit according to another embodiment.
Figure 23:
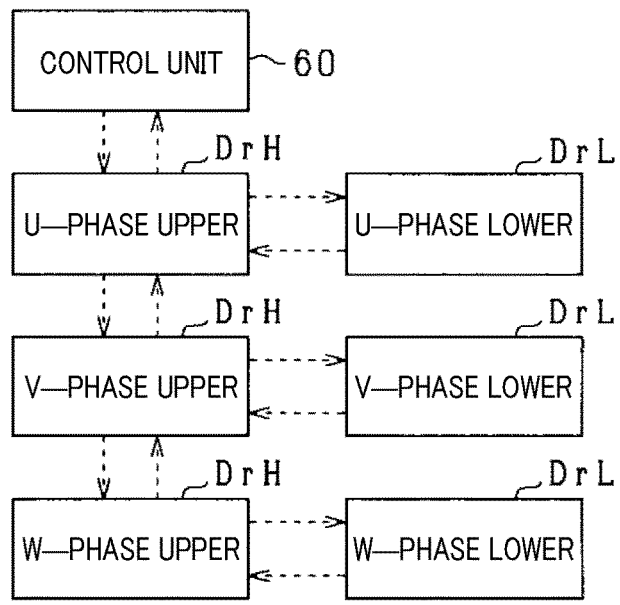
FIG. 23 is a drawing illustrating a communication state between a control unit and each drive circuit according to another embodiment.

The above embodiments may be modified as below. The means for communicating information between the control unit 60 and the drive circuits DrH, DrL is not limited to that illustrated in FIG. 3, but may be, for example, those illustrated in FIG. 22 and FIG. 23. FIG. 22 and FIG. 23 illustrate information communication methods between the control unit 60 and the drive circuits DrH, DrL of the inverter 30.

In this case, the current control section included in at least one of the drive circuits DrH, DrL may calculate the command discharge current Ioff* or the command charge current Ion* based on information transmitted from the other of the drive circuits DrH, DrL. Hence, even when the function of detecting information necessary to calculate the command discharge current Ioff* or the command charge current Ion* (e.g., voltage, temperature, current information) has failed, information of the other drive circuit can be used to continue operation of the inverter 30.

In a configuration in which information can be shared, the maximum value of a phase current can be determined using the fact that the sum of three-phase currents is 0. Based on the maximum value of the determined phase current, the command discharge current Ioff* or the command charge current Ion* can be calculated.

In a configuration in which information can be shared, when the command discharge current Ioff* or the command charge current Ion* can be calculated based on a current in one period of the electrical angle (an amplitude of a phase current), part (e.g., one) of the drive circuits DrH, DrL of the inverter 30 may calculate the off time discharge current Ioffc or the on time charge current Ionc, and the remaining drive circuit may receive the calculated off time discharge current Ioffc or on time charge current Ionc.

The switch of the inverter or the DCDC converter is not limited to an IGBT, but may be, for example, an N-channel MOSFET including a body diode. The switch of the inverter or the DCDC converter may be two or more switches connected to each other in parallel. In this case, the combination of the switches connected to each other in parallel may be, for example, a combination of a switching element made of SiC or a switching element made of Si, or a combination of an IGBT and a MOSFET.

The control unit 60 is not limited to a microcomputer, but may be, for example, a control IC.

The controlled variable of the rotary electric machine is not limited to torque, but may be, for example, a rotational speed of the rotor of the rotary electric machine.

The rotary electric machine is not limited to a permanent magnet synchronous machine, but may be, for example, a field winding synchronous machine. The rotary electric machine is not limited to a synchronous machine, but may be, for example, an induction machine. The rotary electric machine is not limited to be used as an in-vehicle traction unit, but may be used for, for example, a motor configuring an electric power steering device, an electric compressor for an air conditioner, or the like.

The rotary electric machine is not limited to a three-phase one, but may be a six-phase or nine-phase one.

The control system may include any one of the DCDC converter 20 and the inverter 30 only.

The present disclosure has been described according to the embodiments. However, the present disclosure should not be construed as being limited to the embodiments or the configurations. However, the present disclosure encompasses various modifications, or modifications within the range of equivalence. In addition, various combinations and modes, as well as other combinations and modes, including those which include one or more additional elements, or those which include fewer elements should be construed as being within the scope and spirit of the present disclosure.

According to the embodiments, a drive device for a switch is provided. The drive device performs switching of at least one switch (SCH, SCL, SWH, SWL) configuring an electrical power converter (20, 30). The drive device includes: a control section (60) that generates a drive signal for the switch and transmits the drive signal; and at least one drive circuit (DrH, DrL) that receives the transmitted drive signal. The control section generates speed adjustment information for adjusting a switching speed of the switch and transmits the speed adjustment information to the drive circuit. The drive circuit includes: a speed calculation section that receives the transmitted speed adjustment information and calculates command switching speed information of the switch based on the received speed adjustment information; and a drive section that performs switching of the switch based on the received drive signal and the calculated command switching speed information.

According to the embodiments, the control section generates speed adjustment information for adjusting a switching speed of the switch. Since the control section has a function of generating a drive signal for a switch configuring the electrical power converter, the control section can determine control states of the electrical power converter. Hence, compared with a configuration in which a drive circuit detects a voltage between the terminals of a switch and a current flowing to the switch to generate speed adjustment information based on the detection result, appropriate speed adjustment information can be generated based on the control state of the electrical power converter. In addition, since switching of the switch is performed based on the command switching speed information calculated from the generated speed adjustment information, an effect of suppressing a surge voltage and an effect of reducing switching loss can be prevented from decreasing when the switch state is changed.

What is claimed is:

1. A drive device for switching a switch configuring an electrical power converter, the drive device comprising:
a surge detection section that detects a surge voltage generated due to change of a switching state of the switch;
a control section configured to:
generate a drive signal for the switch;
transmit the drive signal;
generate a surge reference value as a speed adjustment signal for adjusting a switching speed of the switch; and
transmit the speed adjustment signal; and
a drive circuit configured to receive the transmitted drive signal, the drive circuit including:
a speed calculation section configured to receive the transmitted speed adjustment signal and calculate a command switching speed signal of the switch based on the received speed adjustment signal such that the surge voltage is equal to or less than the surge reference value; and
a drive section configured to switch the switch based on the received drive signal and the calculated command switching speed signal.

2. The drive device according the claim 1, wherein the speed calculation section calculates the command switching speed signal in relation to a deviation between the received surge reference value and the surge voltage detected by the surge detection section such that the calculated command switching speed signal causes the switching speed to be higher as the deviation increases.

3. The drive device according the claim 2, wherein the speed calculation section calculates the command switching speed signal as an operation amount for feedback control of the deviation to 0, and sets a feedback gain used for the feedback control so as to be larger when the deviation is large than when the deviation is small.

4. The drive device according the claim 1, wherein the drive circuit includes:
an initial value calculation section that calculates an initial value of the command switching speed signal such that the switching speed is less than the command switching speed signal calculated by the speed calculation section; and
a switching section that, if it is determined that a predetermined switching condition is met, changes the command switching speed signal used in the drive section from the command switching speed signal calculated by the speed calculation section to the initial value calculated by the initial value calculation section.

5. The drive device according the claim 4, wherein the initial value calculation section obtains a parameter including at least one of a power-supply voltage of the electrical power converter, a temperature of the switch, and a current flowing to the switch, and calculates the initial value based on the obtained parameter and definition signal in which the initial value is defined in association with the parameter.

6. The drive device according the claim 5, wherein when the command switching speed signal used by the drive section has been set as the command switching speed signal calculated by the speed calculation section, the initial value calculation section stores the command switching speed signal calculated by the speed calculation section as the initial value in association with the parameter.

7. The drive device according the claim 4, wherein the switching section determines whether the predetermined switching condition has been met based on at least one of a power-supply voltage of the electrical power converter and a current flowing to the switch.

8. The drive device according the claim 4,
wherein the switching section determines whether the predetermined switching condition has been met based on at least one of: the detected surge voltage, a power-supply voltage of the electrical power converter, a current flowing to the switch, the surge reference value, and a deviation between the surge reference value and the detected surge voltage.

9. The drive device according the claim 1, wherein
the electrical power converter includes a DCDC converter having a reactor, and an upper arm transformation switch and a lower arm transformation switch that serve as the switch,
the control section generates the drive signal that turns on the upper arm transformation switch and the lower arm transformation switch alternately with a dead time therebetween, and transmits the generated drive signal to the drive circuit corresponding to the upper arm transformation switch and the lower arm transformation switch, and
the drive device further comprises a processing section that, if a condition that a direction of a current flowing to the DCDC converter is changed is met, lowers the switch speed in the DCDC converter.

10. The drive device according the claim 1, wherein
the drive circuit includes an adjustment signal limitation section that receives the transmitted speed adjustment signal and limits the received speed adjustment signal so that a peak value of the surge voltage does not exceed a withstand voltage of the switch, and
the speed calculation section calculates the command switching speed signal based on the speed adjustment signal limited by the adjustment signal limitation section.

11. The drive device according the claim 10, wherein the adjustment signal limitation section limits the speed adjustment signal based on at least one of a power-supply voltage of the electrical power converter, a temperature of the switch, and a current flowing to the switch.

12. The drive device according the claim 1, wherein the drive circuit includes a command signal limitation section that limits the command switching speed signal calculated by the speed calculation section.

13. The drive device according the claim 1, further comprising:
a plurality of the drive circuits; and
a plurality of the switches,
wherein the drive circuits are individually provided for the switches,
the drive circuits are configured to communicate a signal to each other, and
the speed calculation section included in at least one of the drive circuits calculates the command switching speed signal based on signal transmitted from another of the drive circuits.

* * * * *